US009632204B2

(12) United States Patent
Jachmann et al.

(10) Patent No.: US 9,632,204 B2
(45) Date of Patent: Apr. 25, 2017

(54) DUAL ANTENNA FOR CIRCULAR POLARIZATION

(71) Applicant: Halliburton Energy Services, Inc., Houston, TX (US)

(72) Inventors: Rebecca Corina Jachmann, Spring, TX (US); Jie Yang, Paoli, PA (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 15/029,534

(22) PCT Filed: Nov. 13, 2013

(86) PCT No.: PCT/US2013/069907
§ 371 (c)(1),
(2) Date: Apr. 14, 2016

(87) PCT Pub. No.: WO2015/072985
PCT Pub. Date: May 21, 2015

(65) Prior Publication Data
US 2016/0266272 A1    Sep. 15, 2016

(51) Int. Cl.
*G01V 3/32* (2006.01)
*G01R 33/36* (2006.01)
*G01R 33/38* (2006.01)

(52) U.S. Cl.
CPC .............. *G01V 3/32* (2013.01); *G01R 33/36* (2013.01); *G01R 33/38* (2013.01)

(58) Field of Classification Search
USPC .......................... 324/300–322; 600/407–435; 382/128–131
See application file for complete search history.

(56) References Cited

U.S. PATENT DOCUMENTS

| 3,049,662 A | * | 8/1962 | Solomon | G01R 33/24 |
| | | | | 324/301 |
| 4,740,772 A | * | 4/1988 | Prevot | H01F 7/20 |
| | | | | 324/320 |

(Continued)

FOREIGN PATENT DOCUMENTS

| WO | WO-2012170014 A1 | 12/2012 |
| WO | WO-2015072985 A1 | 5/2015 |

OTHER PUBLICATIONS

"International Application Serial No. PCT/US2013/069907, International Preliminary Report on Patentability mailed Mar. 3, 2016", 5 pgs.

(Continued)

*Primary Examiner* — Melissa Koval
*Assistant Examiner* — Tiffany Fetzner
(74) *Attorney, Agent, or Firm* — Gilliam IP PLLC

(57) ABSTRACT

In an example embodiment, a nuclear magnetic resonance (NMR) logging tool comprises an arrangement of one or more magnets that generates a static magnetic field ($B_0$) in a material body. A pair of first and second antenna coils is attached to the tool around an antenna core, wherein the turns of the first and second antenna coils are unaligned with either a longitudinal axis of the tool, or an orthogonal axis substantially transverse thereto. Circuitry drives the pair of first and second antenna coils in concert to produce a radio frequency field ($B_1$) in the material body. In one embodiment, the turns in the first antenna coil are separated from corresponding turns in the second oppositely wound antenna coil by an angle ($\alpha$). In an example embodiment, the angle ($\alpha$) is selected to minimize a power draw of the tool, or maximize one or more of SNR/echo, (I), SNR/time, or (II) of the tool, for a predetermined configuration of the magnet arrangement and antenna core of the tool.

18 Claims, 25 Drawing Sheets

(56) References Cited

U.S. PATENT DOCUMENTS

| | | |
|---|---|---|
| 5,055,788 A | 10/1991 | Kleinberg |
| 5,646,531 A | 7/1997 | Renz |
| 5,705,927 A | 1/1998 | Sezginer et al. |
| 5,712,566 A | 1/1998 | Taicher et al. |
| 5,757,186 A | 5/1998 | Taicher et al. |
| 5,828,214 A | 10/1998 | Taicher et al. |
| 6,018,243 A | 1/2000 | Taicher et al. |
| 6,121,773 A | 9/2000 | Taicher et al. |
| 6,255,818 B1 | 7/2001 | Heaton et al. |
| 6,362,619 B2 | 3/2002 | Prammer et al. |
| 6,522,137 B1 | 2/2003 | Sun et al. |
| 6,525,535 B2 | 2/2003 | Reiderman et al. |
| 6,559,640 B2 * | 5/2003 | Taicher ............... G01V 3/32 324/303 |
| 6,586,931 B2 | 7/2003 | Taicher |
| 6,586,932 B1 | 7/2003 | Taherian et al. |
| 6,781,371 B2 | 8/2004 | Taherian et al. |
| 6,815,950 B2 | 11/2004 | Speier |
| 7,368,909 B2 | 5/2008 | Blanz et al. |
| 7,463,027 B2 | 12/2008 | Prammer et al. |
| 7,501,818 B2 | 3/2009 | Akkurt |
| 7,733,086 B2 | 6/2010 | Prammer et al. |
| 7,755,354 B2 | 7/2010 | Akkurt |
| 7,889,042 B2 * | 2/2011 | Meinke ............... H01F 5/00 336/170 |
| 7,889,046 B2 * | 2/2011 | Meinke ......... G01R 33/34007 336/189 |
| 8,324,895 B2 | 12/2012 | Rottengatter |
| 8,368,403 B2 | 2/2013 | Homan et al. |
| 8,373,412 B2 | 2/2013 | Kruspe et al. |
| 8,417,455 B2 | 4/2013 | Zhong et al. |
| 8,421,454 B2 | 4/2013 | Prammer et al. |
| 8,461,836 B2 | 6/2013 | Blank et al. |
| 8,471,562 B2 | 6/2013 | Knizhnik |
| 9,201,159 B2 * | 12/2015 | Morys ............... G01V 3/32 |
| 9,364,905 B2 * | 6/2016 | Hou ............... G01V 3/28 |
| 2002/0175681 A1 * | 11/2002 | Taicher ............... G01V 3/32 324/303 |
| 2004/0066194 A1 | 4/2004 | Slade et al. |
| 2004/0124840 A1 | 7/2004 | Reykowski |
| 2008/0136410 A1 | 6/2008 | Song et al. |
| 2009/0072825 A1 | 3/2009 | Prammer et al. |
| 2009/0174517 A1 * | 7/2009 | Meinke ......... G01R 33/34007 336/225 |
| 2009/0206974 A1 * | 8/2009 | Meinke ............... H01F 5/00 336/224 |
| 2012/0146415 A1 | 6/2012 | Simsek et al. |
| 2012/0176133 A1 | 7/2012 | Sirigiri et al. |
| 2013/0073206 A1 | 3/2013 | Hou et al. |
| 2013/0093422 A1 | 4/2013 | Morys et al. |

OTHER PUBLICATIONS

"International Application Serial No. PCT/US2013/069907, International Search Report mailed Aug. 13, 2014", 3 pgs.
"International Application Serial No. PCT/US2013/069907, Written Opinion mailed Aug. 13, 2014", 10 pgs.
Akkurt, R., et al., "Nuclear Magnetic Resonance Comes Out of Its Shell", Oilfield Review Winter 2008/2009, 20(4), (2009), 4-23.
Coates, G. R., et al., "NMR Logging: Principles and Applications", Halliburton Energy Services, (1999), 251 pgs.
Kleinberg, R. L., "Probing Oil Wells with NMR", The Industrial Physicist, (1996), 18-21.

* cited by examiner

| | |
|---|---|
| 100 | LOGGING TOOL APPARATUS |
| 104 | HOUSING |
| 108 | MAGNET |
| 130 | PROCESSORS |
| 340 | CHASSIS |

| | |
|---|---|
| 500 | SOLENOID ANTENNA |
| 502 | SECONDARY ANTENNA |
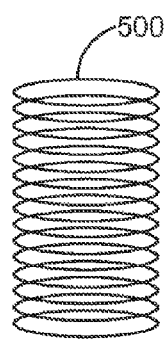    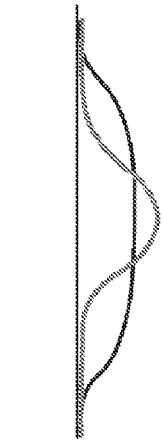
Fig. 5A Fig. 5B Fig. 5C
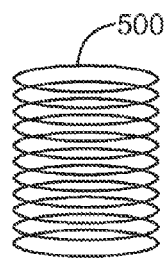  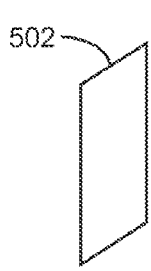  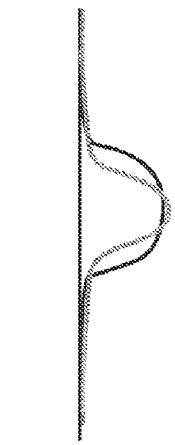
Fig. 5D Fig. 5E Fig. 5F

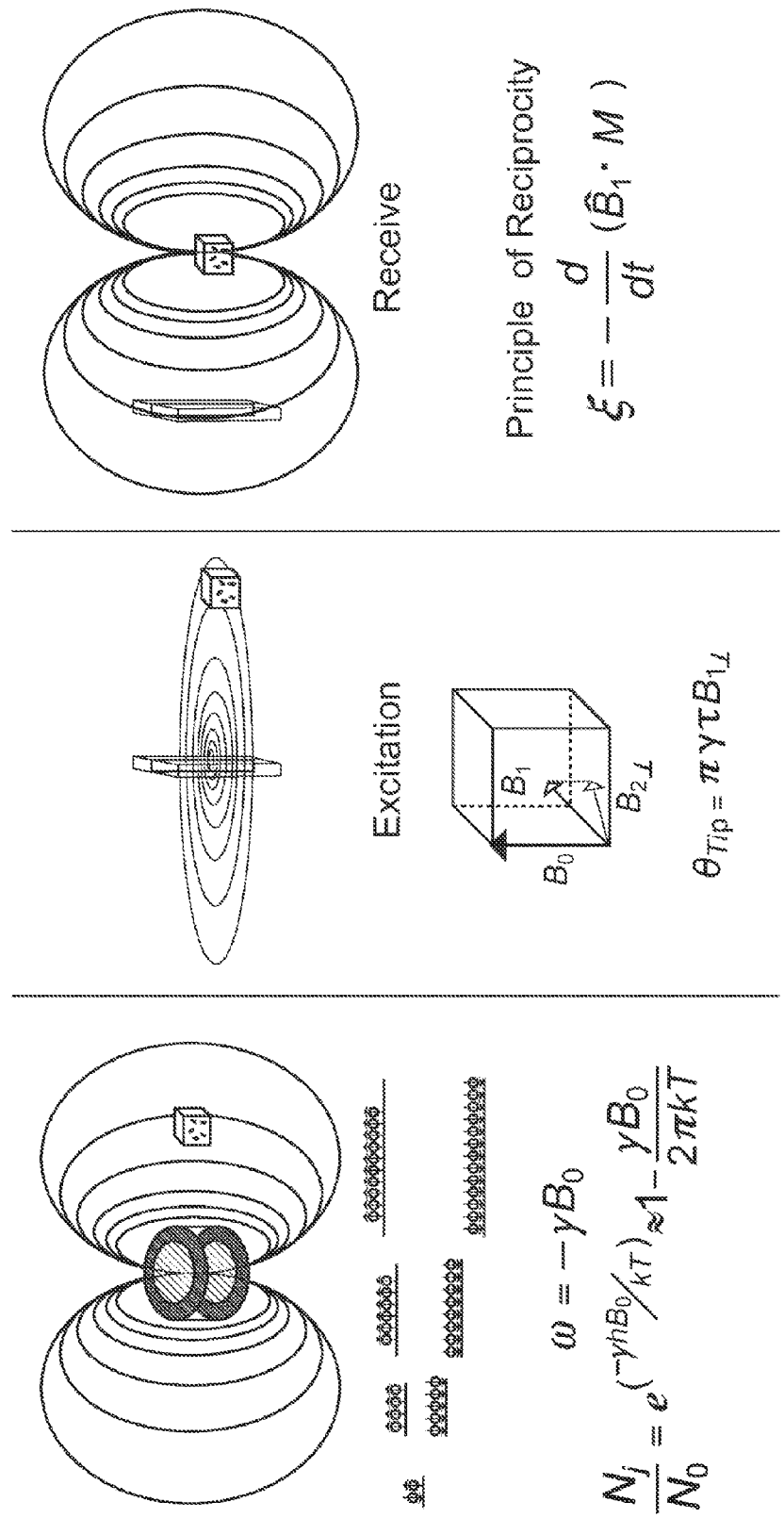

Rotating Frame

Magnetization

B1 field

| | FIELD COORDINATES |
|---|---|
| X | |
| Y | |
| Z | |

DUAL ANTENNA FOR CIRCULAR POLARIZATION

PRIORITY APPLICATIONS

This application is a U.S. National Stage Filing under 35 U.S.C. 371 from International Application No. PCT/US2013/069907, filed on Nov. 13, 2013; and published as WO 2015/072985 on May 21, 2015; which application and publication are incorporated herein by reference in their entirety.

BACKGROUND

Understanding the structure and properties of geological formations can reduce the cost of drilling wells for oil and gas exploration. Measurements made in a borehole (i.e., down-hole measurements) are typically performed to attain this understanding, to identify the composition and distribution of material that surrounds the measurement device down-hole. To obtain such measurements, a variety of sensors are used, including nuclear magnetic resonance (NMR) sensor probes. When used down-hole in conjunction with a magnet and drive electronics, measurements made by the NMR sensor probe can be used to provide information about the surrounding formation.

Generally, nuclear magnetic resonance tools operate by using an imposed static magnetic field and generating this into a material body. This magnetic field is traditionally referred to as the "main magnetic field" or the "static field" as it is usually independent of time and is given the symbol $B_0$. A second magnetic field, which varies in time, is also applied. This field is designated as $B_1$ and is traditionally called the "radio frequency field". It is turned on and off at different increments, known as a pulse. This perturbing field is usually applied in the form of a radio frequency electromagnetic pulse whose useful magnetic component, $B_1$, is perpendicular to the static field, $B_0$. The perturbing field moves the orientation of the magnetization into the transverse (perpendicular) plane. The frequency of the pulse can be chosen to target specific nuclei (e.g., hydrogen). The polarized nuclei are perturbed simultaneously and, when the perturbation ends, they precess around the static magnetic field gradually re-polarizing to align with the static field once again while losing coherence in the transverse plane. The precessing nuclei generate a detectable radio frequency signal that can be used to measure statistical distributions that can be converted into measurements of porosity (i.e., the relative amount of void space in the formation), hydrocarbon saturation (i.e., the relative percentage of hydrocarbons and water in the formation fluid), and permeability (i.e., the ability of formation fluid to flow from the formation into the wellbore). In the majority of NMR measurements, the $B_1$ magnetic field is created by a coil and is powered by a "transmitter". This apparatus constitutes a significant draw of energy and, thus, power consumption is a concern. The amount of power which can be delivered down-hole and the degree and accuracy of NMR measurements taken can, accordingly, be limited by this hardware.

SUMMARY

In an example embodiment, a nuclear magnetic resonance (NMR) logging tool comprises an arrangement of one or more magnets to generate a static magnetic field ($B_0$) in a material body; a pair of first and second antenna coils attached to the tool around an antenna core, wherein the turns of the first and second antenna coils are unaligned with either a longitudinal axis of the tool, or an orthogonal axis substantially transverse thereto; and circuitry that drives the pair of first and second antenna coils in concert to produce a radio frequency field ($B_1$) in the material body.

In some embodiments, the first and second antenna coils of the tool have a common longitudinal axis and are wound around a common antenna core. The first antenna coil may include a spirally wound coil configuration around the antenna core, and the second antenna coil may include an oppositely wound spiral configuration around the common antenna core.

In some embodiments, the turns in the first antenna coil are separated from the corresponding turns in the second oppositely wound antenna coil by an angle ($\alpha$). The angle ($\alpha$) may be in the range of 20 to 160 degrees or 70 to 110 degrees. In some embodiments, the angle ($\alpha$) exceeds 90 degrees. In still further embodiments, the angle ($\alpha$) is selected to minimize a power draw of the tool, or maximize one or more of SNR/echo, SNR*$\sqrt{\text{Gradient}}$, SNR/time, or SNR/$\sqrt{\text{Power}}$ of the tool, for a predetermined configuration of the magnet arrangement and common antenna core of the tool.

In some embodiments, the first and second antenna coils are configured to provide substantially orthogonal radio frequency fields in a material body. The first antenna coil may be energized by radio frequency power having a 90 degree phase difference from radio frequency power energizing the second antenna coil, whereby a circularly polarized RF magnetic field is generated by the tool.

BRIEF DESCRIPTION OF THE DRAWINGS

FIGS. 3-22 illustrate aspects of the present subject matter related to selecting an angle ($\alpha$), according to various embodiments of the invention.

DETAILED DESCRIPTION

To address some of the challenges described above, as well as others, apparatus, systems, and methods are described herein that seek to provide a more efficient NMR tool when compared to conventional apparatus, systems, and methods. The subject matter can be used in the laboratory, as well as down-hole.

Thus, it should be noted that while many embodiments of the invention are described herein with respect to ex-situ use in a geological formation, this was done for reasons of simplicity and clarity. Any of the embodiments described herein may be used ex-situ to determine the characteristics of a wide variety of material bodies in a variety of environments, to include outdoors, indoors, and laboratories. As used herein, a "material body" means any composition of matter that has a substantial (solid or liquid) character. Thus, a material body includes a geological formation, human tissue, component assemblies, a fiber composite, water in a tank, glycerol, oil, etc. Various example embodiments that can provide some or all of these advantages will now be described in detail.

Figure 1:
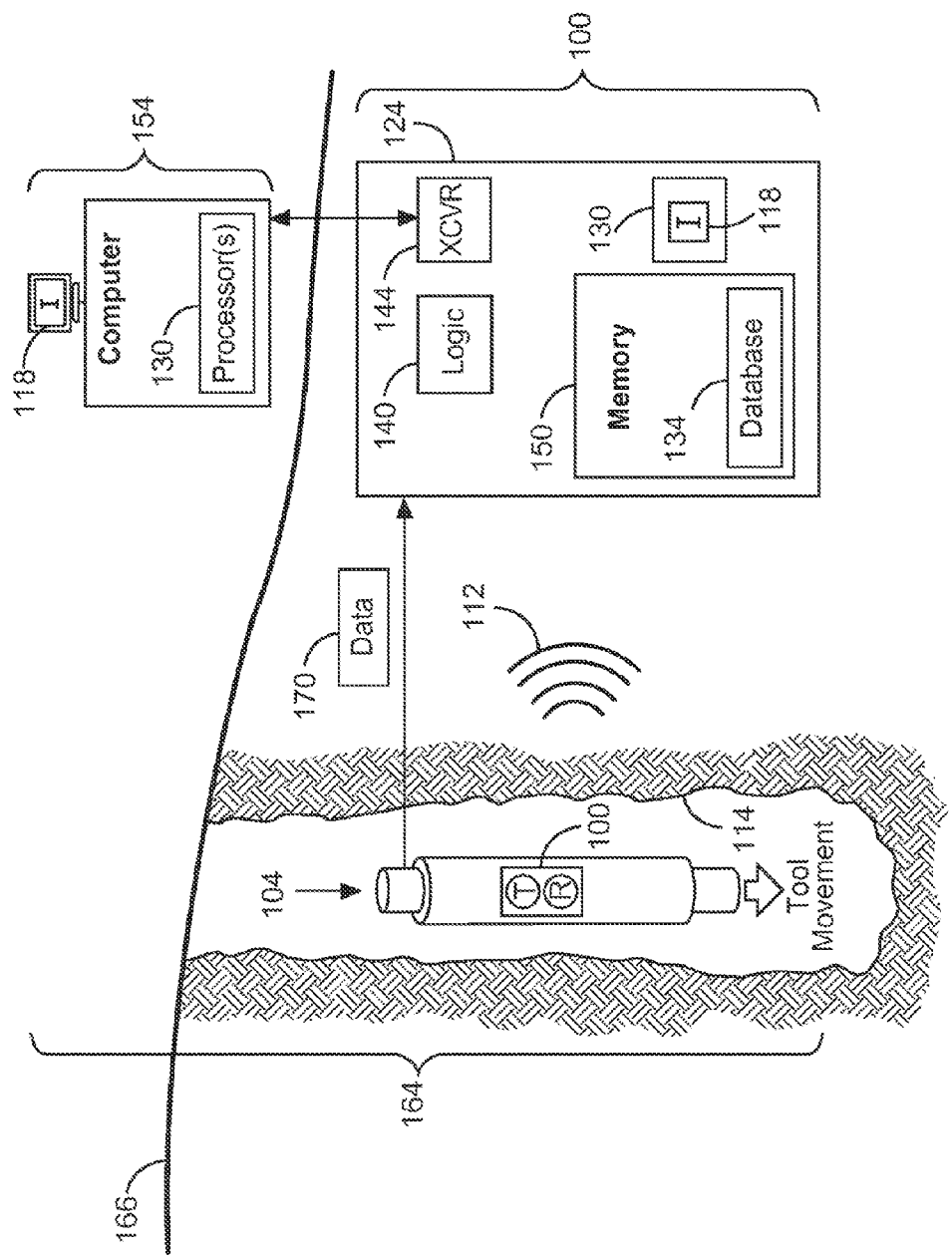
FIG. 1 is a block diagram of apparatus and systems, according to various embodiments of the invention.

FIG. 1 is a block diagram of ex-situ apparatus 100 and systems 164, according to various embodiments of the invention. In some embodiments, the system 164 comprises one or more of the ex-situ apparatus 100, which may include a housing 104.

Processor(s) 130 that form part of the ex-situ apparatus 100 may be located at the Earth's surface 166, as part of a surface logging facility 154, or in a data acquisition system 124 above or below the Earth's surface 166. In some embodiments, one or more processors 130 are packaged with the ex-situ apparatus 100 and attached to the housing 104. As used herein, the term "attached" can refer to direct attachment (where one component is physically coupled to another, without an intervening element), or indirect attachment (where one component is physically coupled to another, via at least one other intervening element). The system 164 may comprise a data transceiver 144 (e.g., a telemetry transmitter and/or receiver) to transmit acquired data 170 provided by one or more electromagnetic transmitter and receiver pairs, and a magnet that forms part of the ex-situ apparatus 100.

Logic 140 can be used to acquire and process the data 170 received from sensors forming part of the ex-situ apparatus 100, according to the various methods described herein. For example, the logic 140 may comprise filters, such as quadrature filters, to filter the data 170. Received data and filtered data can be stored in the memory 150, perhaps as part of a database 134. Images 118 may be generated from the data 170 by the processors 130, and stored in the memory 150 or sent to the surface logging facility 154 for storage and/or display. Thus, many embodiments may be realized.

For example, an ex-situ apparatus 100 may comprise one or more electromagnetic transmitter and receiver pairs (T, R) attached to a housing 104, such as a down-hole tool, as well as one or more processors 130 attached to the down-hole tool. A series of externally pulsed projected oscillating magnetic fields 112 are generated via turning the transmitter T on and off.

In a geological formation 114, or in any other material body (e.g., a human body, a fiberglass composite aircraft wing, etc.), a variety of pulse types, such as wide band, frequency modulated pulses, and/or chirp pulses, (wide band phase modulated pulses), can be used to create the magnetic fields 112. In between pulses, the processors 130 can be used to record raw echo free induction decay (REFID) signals provided by the receiver R. For example, the REFID signals may be present during an echo acquisition period that follows each one of a series of modulated pulses forming part of a pulse train transmitted by the transmitter, T. For the purposes of this document, the reader should note that the REFID signal described herein is different from the integrated result of a quadrature-detected signal.

Figure 2:
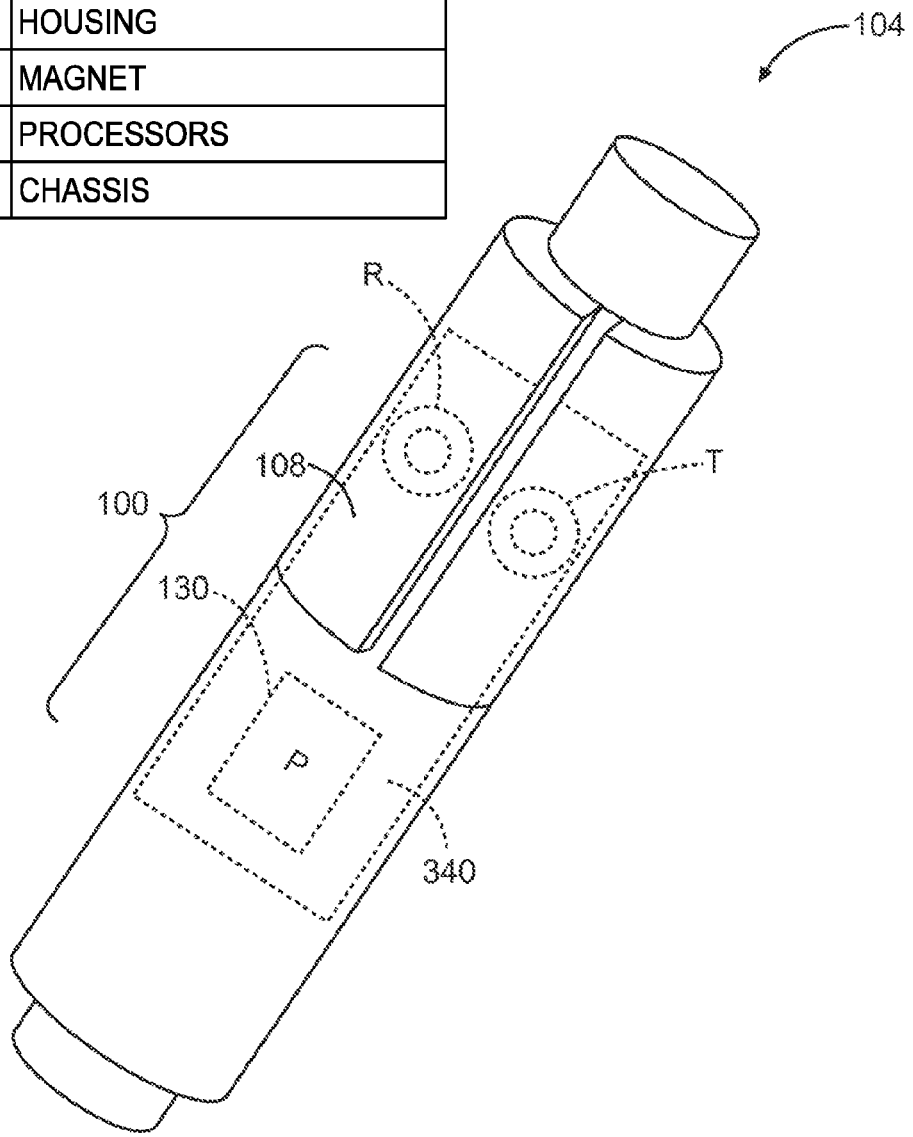
FIG. 2 illustrates a perspective view of a housing comprising a down-hole tool attached to an apparatus, according to various embodiments of the invention.

FIG. 2 illustrates a perspective view of a housing 104 comprising a down-hole tool attached to an ex-situ apparatus 100, according to various embodiments of the invention. Here the ex-situ apparatus 100 is shown to comprise at least one electromagnetic transmitter T and receiver R pair, as well as a magnet 108. Although the transmitter and receiver coils are shown as being separate elements in FIG. 2, the coils of these elements may overlap in some embodiments.

The ex-situ apparatus 100 also comprises one or more processors 130. The processors 130 can be used to locate the preferred NMR frequency for the electromagnetic transmitter T and receiver R pair, as well as to acquire NMR data, from which formation images 118 (see FIG. 1) and other information about the formation can be derived, including formation permeability values. In some embodiments, the components of the apparatus 100 are assembled together, into a single unit. Thus, the apparatus 100 may be configured so that one or more of the electromagnetic transmitter and receiver pairs (T, R), and the processor(s) 130, are attached to a common chassis 340 (e.g., mounted outside or inside a housing 104, as shown in FIG. 2).

Figure 3:
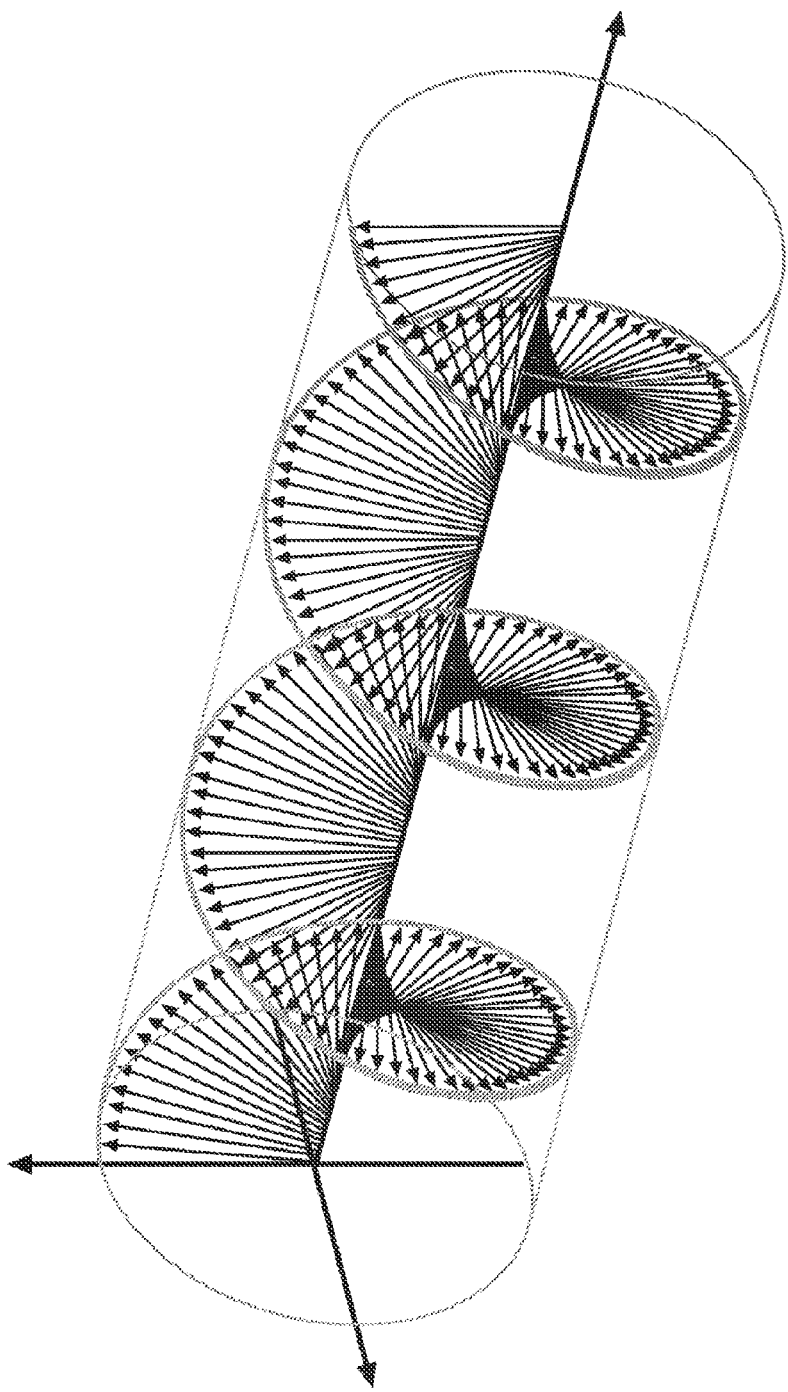

The present subject matter utilizes two antennae (or receivers), which may, in some embodiments, have respective longitudinal axes which are generally perpendicular in an NMR system. The use of two antennae and consequently two transmitters, in the methods described herein, can lead to a reduction of the power required to do a NMR experiment. The power required to generate the perpendicular fields to create the circular polarization utilized in NMR methods can be more efficiently utilized. FIG. 3 illustrates example circular polarization used in the present NMR techniques. A number of antennae can be utilized in the present methods, but it is envisaged that coupling difficulties may preclude use of more than two or three antennae in optimum embodiments.

Figure 4:
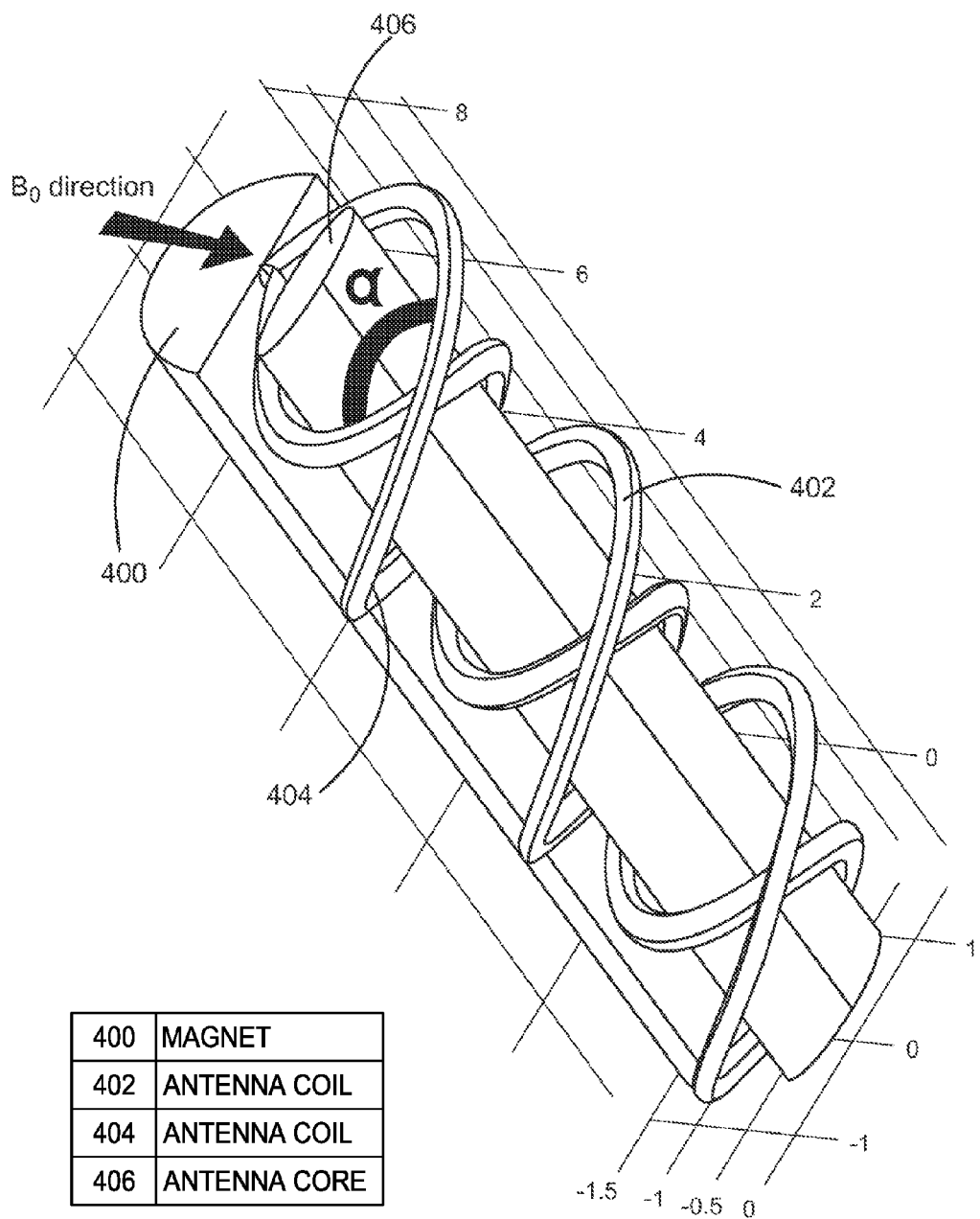

FIG. 4 illustrates an example configuration of antenna windings, magnet, and core that may be employed in the tool of FIG. 2, for example. An elongate permanent magnet 400 is aligned with the longitudinal axis of the tool. The illustrated magnet 400 has a generally semi-circular outline in cross section but in other examples can have another suitable cross sectional shape. In use, the magnet 400 generates a "main magnetic field" or "static field" $B_0$ in the direction generally indicated by the arrow $B_0$ in the view. This direction is substantially perpendicular to the longitudinal axis of the magnet 400 and will typically lie in the direction of the intended measurements to be taken by the NMR tool. The longitudinal axis of the magnet 400 may align with or be parallel to the longitudinal axis of the tool in which the magnet is placed.

Positioned adjacent the magnet 400 are first and second antenna coils 402 and 404 wrapped around a common antenna core 406. Other configurations of antenna core are possible. The turns of the antenna coils 402 and 404 lie neither in the plane of the tool axis or the tool cross section. Further, the turns of the first and second antenna coils 402 and 404 are unaligned with either a longitudinal axis of the tool or an orthogonal axis substantially transverse thereto. In contradistinction, in conventional tools, the longitudinal axis of a conventional antenna coil is aligned either with the longitudinal axis of the tool in which the coil is fitted, or orthogonal to the longitudinal axis (a transverse axis). The turns of conventional antenna coils are, therefore, substantially in alignment with the longitudinal or transverse axis or in alignment with planes extending in the directions of these axes. It may be argued that the turns of conventional coils are slightly out of alignment with the main axes (or planes in these directions) by dint of the helical or spiral configuration of the conventional coils. However, this misalignment is not appreciable and the effect of separating the turns of the antenna coils by an optimum angle to achieve the advantages of the present invention has not been appreciated.

The present subject matter can be distinguished over conventional NMR tools. In some embodiments, the turns of the present antenna coils (i.e., 402, 404) are unaligned with either a longitudinal axis of the tool, or an orthogonal axis substantially transverse thereto, and arranged in such a way in order to minimize a power draw of the tool, or maximize one or more of SNR/echo, SNR*√Gradient, SNR/time, or SNR/√Power of the tool, for a predetermined configuration of the magnet arrangement and common antenna core 406 of the tool.

In some embodiments, irrespective of the orientation of the turns of the antenna coils with respect to the longitudinal or transverse axes of the tool (i.e. whether the antenna coil turns are aligned with these axes, or not), the coils of turns in one antenna coil may simply be separated angularly from turns in another antenna coil and arranged in such a way in order to minimize a power draw of the tool, or maximize one or more of SNR/echo, SNR*√Gradient, SNR/time, or SNR/√Power of the tool, for a predetermined configuration of the magnet arrangement and common antenna core 406 of the tool. In some embodiments, the turns of the antenna coils (i.e., 402, 404) may be unaligned with the main axes of the tool by dint of their longitudinal axes being unaligned with such axes, or because the turns themselves are unaligned with such axes. The turns of the antenna coils (i.e., 402, 404) of the present subject matter may overlap (around a common core for example), or may be provided in separate coils. Other configurations are possible.

In some embodiments, the turns in one antenna coil may be separated from corresponding turns in the second oppositely wound antenna coil by an angle ($\alpha$). This angle of separation may exist between turns of overlapping coils, or turns of separate coils. Thus, instead of the insignificant or unrecognized misalignment of coil turns of conventional NMR tools, the angle ($\alpha$) may, in some embodiments, be in the range of 20 to 160 degrees, or 70 to 110 degrees. In some embodiments, the angle ($\alpha$) of separation exceeds 90 degrees.

In some embodiments, the first and second antenna coils 402 and 404 of the tool have a common longitudinal axis and are wound around a common antenna core, such as the core 406 shown in FIG. 4. The first antenna coil 402 includes a spirally wound coil configuration around the common antenna core 406, and the second antenna coil 404 may include an oppositely wound spiral configuration around the common antenna core 406. The spiral coil configurations may be generally as shown in FIG. 4, but other coil configurations are possible. Example dimensions of the antenna windings, magnet, and core configuration shown in FIG. 4 are given by the illustrated dimension grid. For example, the overall length of the configuration may be approximately eight inches, the width approximately two inches, and the depth (in the view) approximately one and a half inches.

In some embodiments, the turns in the first antenna coil 402 are separated from corresponding turns in the second oppositely wound antenna coil 404 by an angle ($\alpha$), shown in the view. In order to optimize certain aspects of the tool (described in more detail further below), a particular angle ($\alpha$) separating the turns of the coils (i.e., 402, 404) may be identified and incorporated into the design of the tool. The angle ($\alpha$) may, for example, be selected to minimize a power draw of the tool, or maximize one or more of SNR/echo, SNR*√Gradient, SNR/time, or SNR/√Power of the tool, for a predetermined configuration of the magnet, antenna and/or core of the tool. A signal-to-noise ratio is designated "SNR" in this specification. In some examples, the angle ($\alpha$) is in the range of 20 to 160 degrees, or 70 to 110 degrees. In some embodiments, the angle ($\alpha$) exceeds 90 degrees. The first and second antenna coils (i.e., 402, 404) are generally configured to provide substantially orthogonal radio frequency fields in a material body or volume of interest.

In use, the first antenna coil 402 may be energized by radio frequency power having a 90-degree phase difference from radio frequency power energizing the second antenna coil 404, such that the tool generates a circularly polarized RF magnetic field.

In conventional embodiments, primary and secondary antennae (receivers) are disposed to lie parallel and perpendicular to the tool axis, respectively. A significant issue with this configuration is the impaired ability to get RF field strength in the same volume. If the volumes are not matched then any field strength increase is minimized and possibly significantly compromised via stimulated echoes or phase incoherence returning to the antennae. A solution to this can include decreasing the primary antenna's length such that the two volumes can be matched. But in this case, the matched volume is decreased and the signal level decreases accordingly.

FIGS. 5A-5F show illustrative views of conventional antenna arrangements. In comparing FIGS. 5A and 5D, for example, a primary solenoid antenna 500 extending across the length of the tool can suffer the drawback of enabling a shorter sensitive volume. Using a high permeability material inside of the antenna as a core might increase the sensitive volume length; however, higher permeability materials (over 50 Henries per meter, H·m−1) tend to be more conductive and, thus, introduce either signal losses or ringing. In FIGS. 5B and 5E, a rectangular secondary antenna 502 of chosen length extends down the length of the tool. When a longer rectangular antenna 502 is used, such as in FIG. 5B, there is an increase in SNR because of the increase in sensitive volume length, but the matched volume between the secondary rectangular antenna 502 and the primary solenoid antenna 500 is low. If a shorter rectangular antenna 502 is used, such as in FIG. 5C as compared with FIG. 5F, the matching volumes between the two antennae are better, but less volume is being measured resulting in reduced SNR gain.

In cases where there is sufficient power to run an NMR tool, the available power can generally be used in two ways. First, the tool bandwidth could be increased; however, there is a limit as to how short of a pulse the driving circuitry can deliver, notwithstanding the abundance of available power. Secondly, one could increase the number of frequencies used to collect measurement signals; however, there typically needs to be a wide separation of frequencies for a large bandwidth. The present configuration allows a user to increase the length of the antenna to use all available power, and utilize the efficiency of that power by the circular polarization technique. This is because each antenna is not limited in length by the field it creates, as with the solenoid antennae discussed above.

Figure 6A:
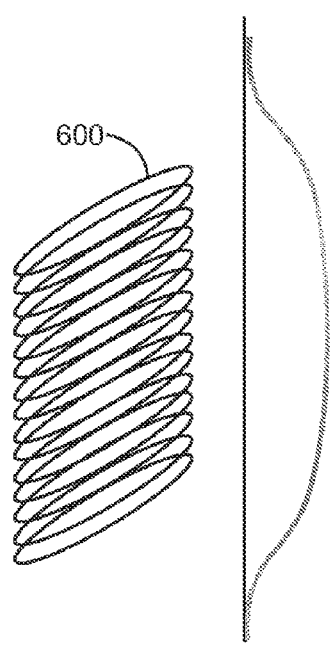
Figure 6B:
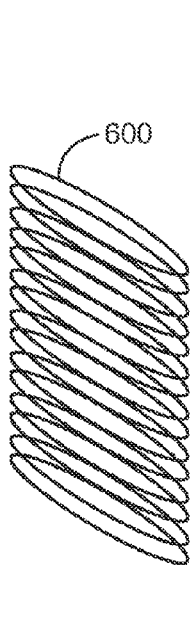
Figure 6C:
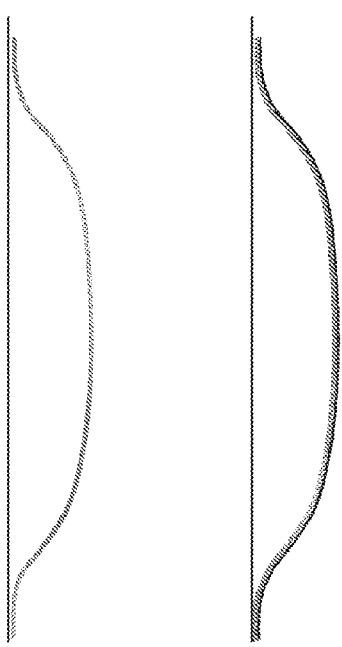

FIGS. 6A-6C of the accompanying drawings illustrate example antenna configurations of the present subject matter. Two circular polarization antennae 600 and 602 are shown (in FIGS. 6A and 6B, respectively). The two antennae 600 and 602 are the same length but "left" and "right" hand turned versions of each other. In one embodiment, the antennae 600 and 602 may, respectively, be oppositely wound around a core, for example, in substantially the same manner described above with reference to FIG. 4. In some embodiments, the antennae 600 and 602 constitute the same coil wrapped in different directions, or as mirror images of each other. In this way, the field strength of the antennae 600 and 602 will better match along the lengths of the antenna 600 and 602, as shown in FIG. 6C. Some mismatches in the fringe areas, however, may still exist.

As discussed above with reference to FIG. 2, an angle ($\alpha$) separating the turns of the respective antennae 600 and 602 may be optimized to enhance certain aspects of the NMR tool. In some examples, a separation angle of less than 45° may not be possible because of the effect of the permeable material running through the antenna 600 and 602. The permeable material aids in focusing the RF field outward and decreasing the ringing within the magnet, and can also affect the ideal separation angle.

The angle ($\alpha$) can be optimized in a number of ways, and the optimization is not necessarily limited to any particular method. Some examples are disclosed here. The effectiveness or performance of the present NMR tool can be evaluated using a number of different terms, such as: SNR/echo, SNR*$\sqrt{Gradient}$, SNR/time, or SNR/$\sqrt{Power}$. An important goal during logging is to obtain as many signals as possible per unit of time. One way to seek that goal is to utilize substantially all the power available in an experimental time period (for example, around 6-18 seconds). In one approach, the optimum angle ($\alpha$) can be identified by making numerous configurations of antennae, magnets, and cores, and testing them with the electronics of the tool for the optimum SNR response, the minimum power draw, and so forth per the desired or optimized value terms set out above.

Another approach to optimize the angle ($\alpha$) is to model the system mathematically and calculate the signal response using, for example, block equations and the principle of reciprocity. The theory underlying the modeling approach is set out below.

Consider that an NMR experiment may be conducted on a sample of a material body with non-zero nuclear magnetic spin. When placed in a magnetic field, the generated magnetic "spins" tend to align more towards that magnetic field than not, according to the Boltzmann distribution (see, for example, FIG. 7A). This magnetic field, given the symbol ($B_0$), is traditionally referred to as the "main magnetic field" or the "static field" as it is usually independent of time. The bulk effect of nuclear magnetic spin alignment is called the magnetization and given the symbol M. This effect can be thought of as mini localized magnetic fields.

A second "time varying" magnetic field is also applied (see, for example, FIG. 7B). This field is designated as ($B_1$) (also called the "radio frequency field") and is turned on and off at different increments, known as a pulse and resonates at a frequency, $\omega$. The ($B_1$) magnetic field in the majority of NMR experiments is created by a coil and is powered by a "transmitter" (see FIG. 4). In down-hole NMR methods, the transmitter component can be a major draw of energy. The amount of power which can be delivered into the formation down-hole is limited by this hardware component. The advantages a two-antenna (or more) system presented here can be considered in two ways: first, in lowering the power consumption while maintaining the ($B_1$) field strength or, second, in maintaining the power consumption but delivering either more pulses of ($B_1$), or stronger ($B_1$) pulses. The increased usable power available in the transmitter can optimize the utility of the tool. Advantageous aspects, such as shorter experiment time and fewer signal echoes, become possible.

Figure 7D:
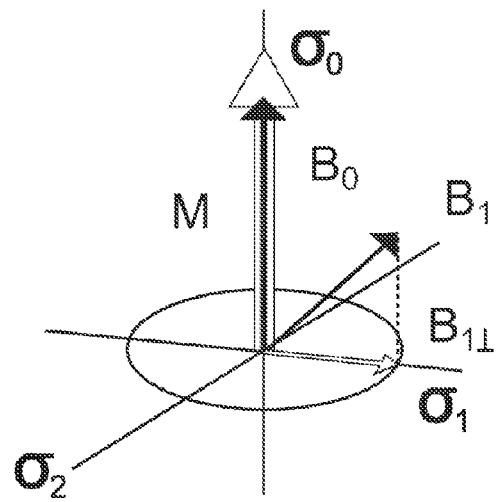

An NMR experiment depends on the interactions of the $B_1$ and $B_0$ fields through the nuclear spin in an object or volume of interest. In identifying the optimum angle ($\alpha$) for a predetermined configuration of the magnet arrangement and common antenna core of the tool (i.e., 406), one may consider the configuration to exist in an arbitrary $R^3$ orthonormal basis set, 60, 61, 62, such as shown in FIG. 7D.

The $B_0$ direction at any point dominates the interaction when $B_0 \gg B_1$, which is normally the case for down-hole tools. This implies that only portions perpendicular to the $B_0$ direction will matter for $B_1$. When considering how the $B_1$ field acts this means that only an $R^2$ space will need to be considered. This particular plane will then be called the perpendicular plane, while the direction of $B_0$ is designated as the parallel direction.

The last part of the NMR experiment is to receive a signal from the excited nuclear spins. This occurs according to the principle of reciprocity where the nuclear spins act as mini transmitting coils, for example as shown in FIG. 7C.

The received data, in contemporary down-hole experiments, reveals two characteristics of magnetization: longitudinal recovery and transverse relaxation. Both of these measurements require the magnetization to be perturbed from its equilibrium state and alignment with the static field. These involve measurements of the magnetization rates to equilibrium from the perturbed states in the directions parallel and perpendicular to the $B_0$ field. However, a third return to equilibrium is possible (known as $T_{rbo}$), but this return is not commonly used down-hole at this time.

Figure 8A:
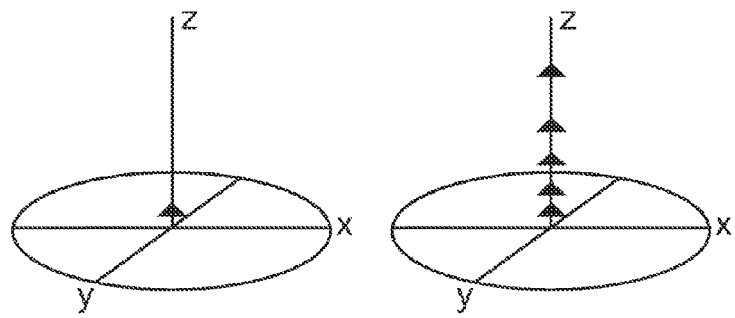
Figure 8B:
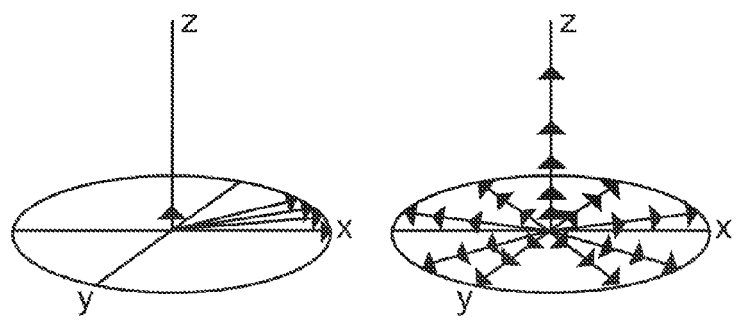

With reference to FIGS. 8A-8B, the perturbation by the $B_1$ field manipulates the orientation of the magnetization such that the measurements for T1 (longitudinal recovery as seen in FIG. 8A) and T2 (transverse relaxation as seen in FIG. 8B) can be made. Two specific manipulations are the main focus of most NMR experiments down-hole. Other more complicated manipulations (rotation) are possible and can be useful, but only the most common manipulations, will be discussed. The first is a manipulation such that the magnetization is in the perpendicular plane, commonly called a "90" or "$\pi/2$" pulse. The second manipulation is an "inversion": it causes the magnetization to point in the opposing direction. From an equilibrium standpoint, that would mean in the anti-parallel direction to the static field. This pulse is commonly referred to as a "180" or "$\pi$" pulse. By timing the pulse length or changing its amplitude, the magnetization can be rotated any amount.

Figure 9A:
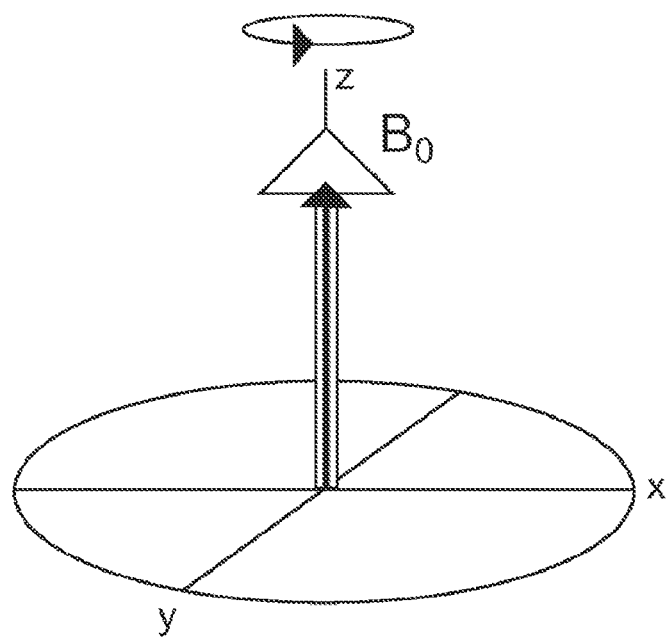

Before moving on, consider why a circularly polarized field is needed to make these manipulations. This notion stems from the nature of the magnetization. Along with a containing a magnitude, it precesses at the angular frequency of $\omega_0 = -\gamma B_0$. Here, we will look at it in a classical sense. This system is a quantum phenomenon, meaning it is transitioning through "states" as opposed to a physical object spinning. The precession is around a magnetic field. The system in equilibrium will look something like that of FIG. 9A. The magnetization is aligned with the $B_0$ magnetic field and rotates on its axis around the $B_0$ direction.

Figure 9B:
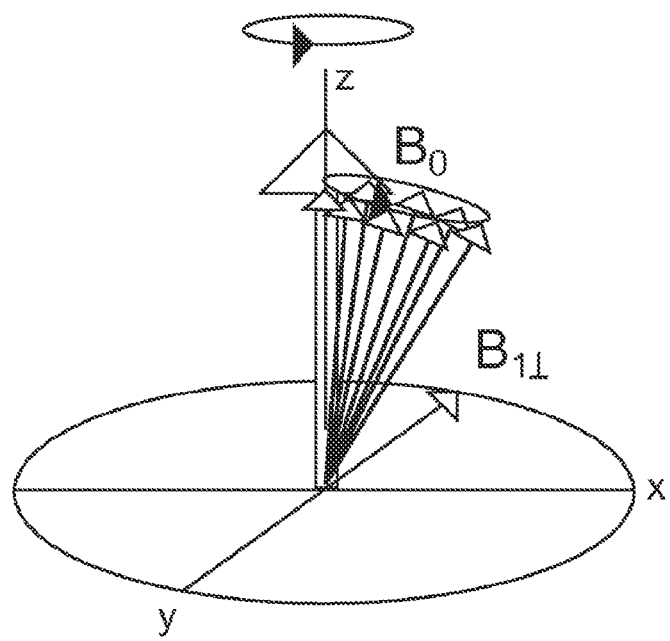

There are two ways of passing current through a coil: direct current and alternating current. FIG. 9B demonstrates the manipulation due to a direct current. Note that it cannot create the $\pi/2$ or $\pi$ pulses. This is because magnetization precess around the $B_{1\perp}$'s field when it is active, but does not stop precession around the $B_0$ magnetic field. The precession can be expressed as: $M_j = R_\parallel R_\perp M_i$, where $M_i$ is the direction and magnitude of the magnetization after it has under gone the ith rotation. The static field is much greater than the $B_1$ field so the rotation in the parallel field overpowers the rotation in the perpendicular direction. In principle, this can be seen as slightly adjusting the direction of the $B_0$ field. An alternating current is capable of creating circular polarized fields.

With reference to FIGS. 10A-10F, the creation of these fields will now be discussed. Consider a circular polarized $B_1$ field, which is turning at the same rate as the magnetization, $\omega_0$. In a laboratory-based frame it is not readily apparent why a circular polarized field rotates the magnetization into the transverse plane. FIGS. 10A-10F show a laboratory-based frame of reference and another one called the rotation frame of reference. In the rotating frame, two aspects may be considered. The first is that the rotation of the magnetization around the parallel axis ceases, and the second is that the $B_1$ field appears stationary. The $B_0$ field has, in effect, disappeared and now the only field for the magnetization to precess around is the $B_1$ field. By adjusting the time the RF field is allowed to be on, or the strength of the applied field, different rotations of the magnetization towards, at, or past the transverse plane can be achieved.

Figure 10C:
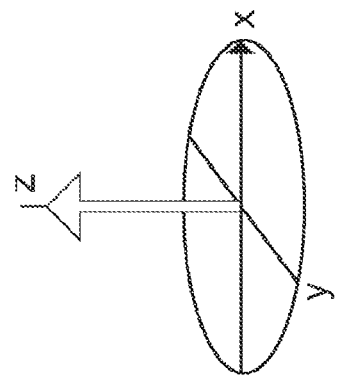
Figure 10B:
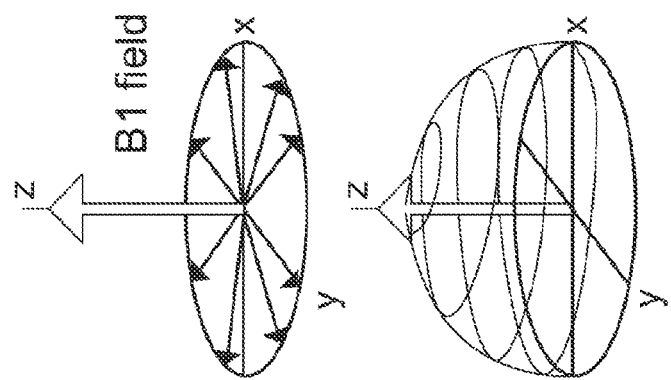
Figure 10A:
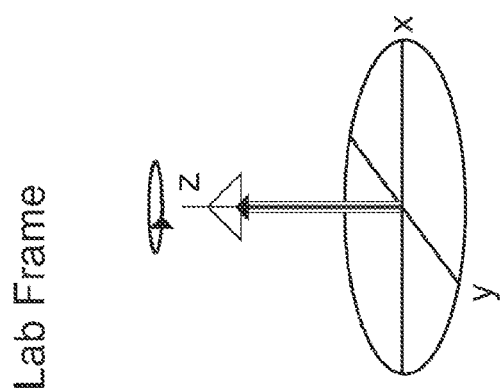
Figure 10F:
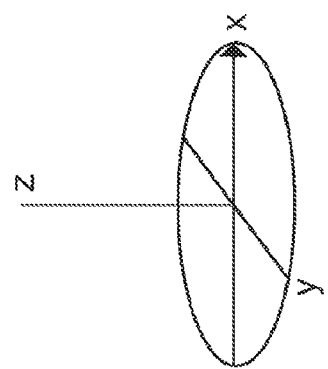
Figure 10E:
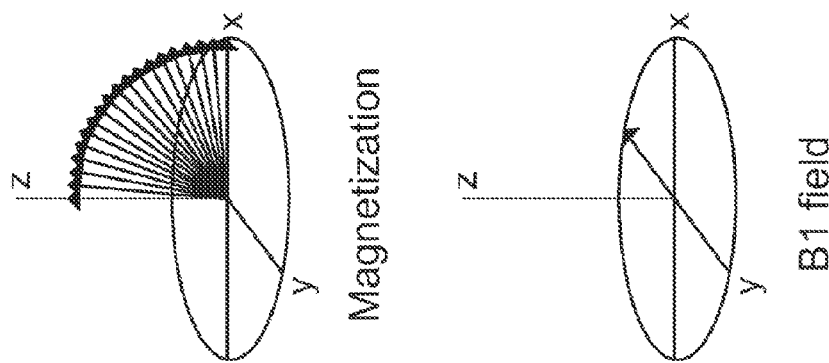
Figure 10D:
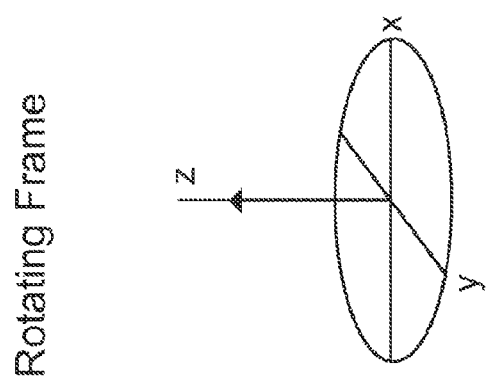

Now that the influence and character of the $B_1$ field has been explained, one can closely examine how an antenna coil creates circular polarization. It may be helpful to explain the operation of a single antenna coil before considering two coils since, although the relevant parts of each $B_1$ field are always orthogonal to the $B_0$ field, multiple $B_1$ fields are not always orthogonal to each other. FIGS. 10A and D show the magnetization prior to pulsing (starting an RF field) and the magnetization is aligned with the $B_0$ field. The upper view in FIG. 10B shows an RF ($B_1$) magnetic field in a polarized circular motion. The field is rotating around the $B_0$ field (since only the perpendicular part matters here). The lower view in FIG. 10B shows the path the magnetization takes in a laboratory-based frame. Since the magnetization rotates around both the $B_0$ and the $B_1$ fields it moves in a downward path tracing out the walls of a sphere. The lower view in FIG. 10E shows the $B_1$ field in the rotating frame. Since the frame rotates at the same frequency of the $B_1$ field it is completely still. The upper view in FIG. 10E shows the path of the magnetization. The magnetization rotates in the plane perpendicular to the $B_1$ field. FIGS. 10C and 10F both show the magnetization after the $B_1$ field has been turned off. This demonstrates a 90 degree tip.

Figure 11:
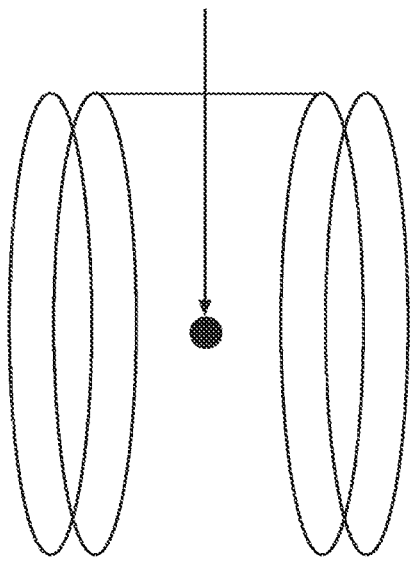
Figure 12:
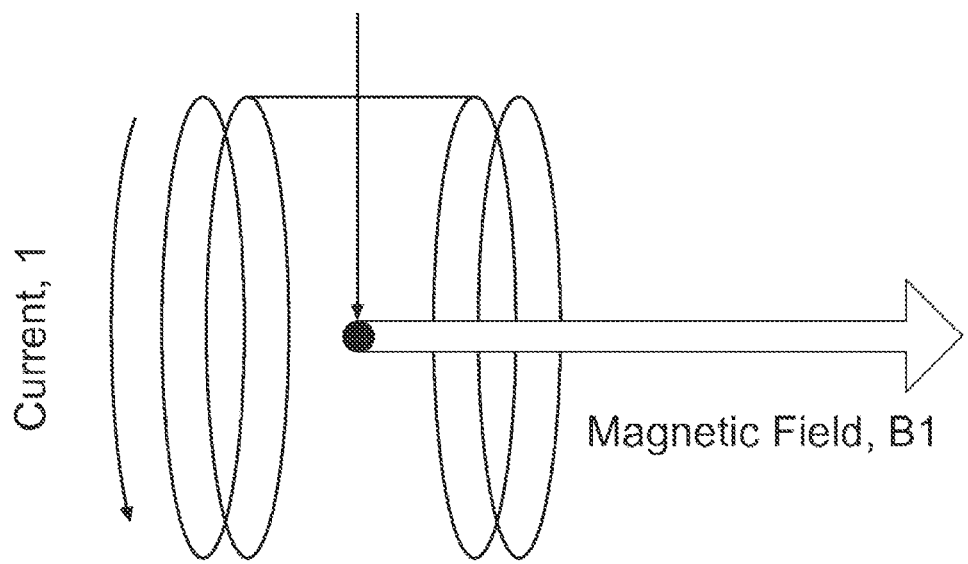
Figure 13:
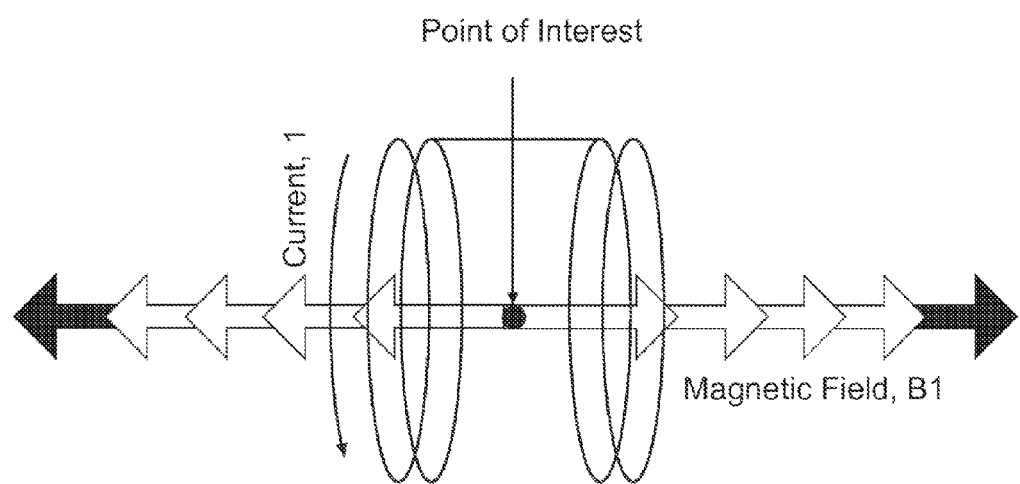

With reference to FIG. 11, a single point, the "point of interest" can be selected arbitrarily, meaning it can represent any point. The point of interest can thus represent all points. The magnetic field, $B_1$, at that point can be calculated using Maxwell's equations. When a direct current or constant current is applied in the coil, a stationary magnetic field is created. This is the maximal amplitude of a magnet field that can be created with a particular coil configuration and current. This is shown, for example, in FIG. 12. When an alternating current, $I=A\cos(\omega_0 t+\phi)$, is applied the magnetic field's amplitude varies with time, $B_1=|B_1|\cos(\omega_0 t+\phi)$. This is shown, for example, in FIG. 13. An additional phase shift, $\varphi$, is subtracted from the B1 due to retardation (time lag) and non-vacuum conditions, $B_1=\beta_1|\cos(\omega_0 t+\phi-\varphi)$. This phase is often represented by using complex numbers in a finite element analysis. The above term for B1 is expanded using: $\cos(\alpha-\beta)=\cos(\alpha)\cos(\beta)+\sin(\alpha)\sin(\beta)$ giving:

$$B_1=|B_1|(\cos(\omega_0 t+\phi)\cos(\varphi)+\sin(\omega_0 t+\phi)\sin(\varphi))=B_1^{Re}\cos(\omega_0 t+\phi)+B_1^{Im}\sin(\omega_0 t+\phi)$$

where $$(B1^{Re}=\cos(\varphi), B1^{Im}=\sin(\varphi), \text{ and } \omega=\tan^{-1}(B1^{Im}/B1^{Re})).$$

The circular polarization existing in this field is shown by decomposing it into two counter rotating components: $B1^{(+)}$ and $B1^{(-)}$. For simplicity the basis set, which is now the $R^2$: $\sigma_1, \sigma_2$, is selected to be real and imaginary.

$$B1 = |B1|\cos(\omega_0 t + \phi - \varphi) =$$
$$\frac{|B1|}{2}\cos(\omega_0 t + \phi - \varphi) + \frac{|B1|}{2}i\sin(\omega_0 t + \phi - \varphi) + \frac{|B1|}{2}\cos(\omega_0 t + \phi - \varphi) -$$
$$\frac{|B1|}{2}i\sin(\omega_0 t + \phi - \varphi) = |B1|\frac{e^{(\omega_0 t+\phi-\varphi)i} + e^{-(\omega_0 t+\phi-\varphi)i}}{2}$$

such that $$B1^+ = \frac{|B1|}{2}\cos(\omega_0 t + \phi + \varphi) + \frac{|B1|}{2}i\sin(\omega_0 t + \phi + \varphi) = \frac{|B1|}{2}e^{(\omega_0 t+\phi-\varphi)i}$$

and $$B1^- = \frac{|B1|}{2}\cos(\omega_0 t + \phi + \varphi) - \frac{|B1|}{2}i\sin(\omega_0 t + \phi + \varphi) = \frac{|B1|}{2}e^{-(\omega_0 t+\phi-\varphi)i}$$

Figure 14:
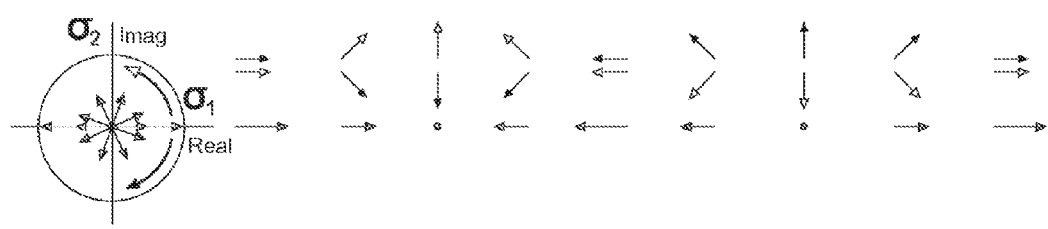
Figure 15A:
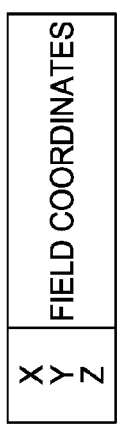
Figure 15B:
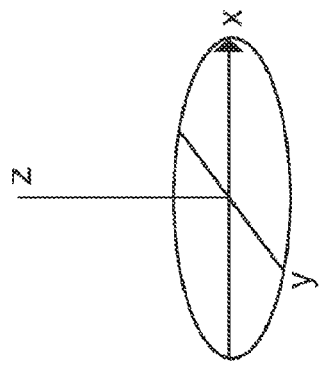
Figure 15B:
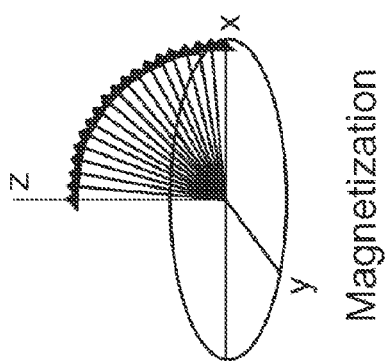
Figure 15C:
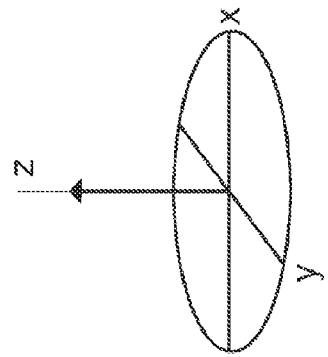
Figure 16:
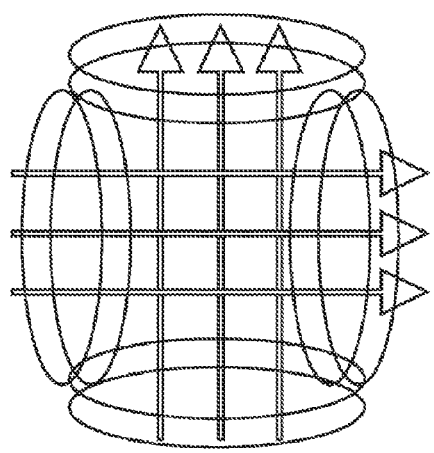

The net effect of the two counter rotating components can be seen in FIG. 14. One of these components, the one rotating in the same direction (+) as the magnetic moment, contributes largely to the NMR signal while the other does not. This means that substantially half of the energy used to create the ($B_1$) field is wasted. In the rotating frame, shown in FIGS. 15A-15C, this component is the field rotating at $-2\omega_0$. A second antenna, offset from the first one, can be used to create a circular polarized field, for example as shown in FIG. 16, in which this energy is not wasted.

Figure 17:
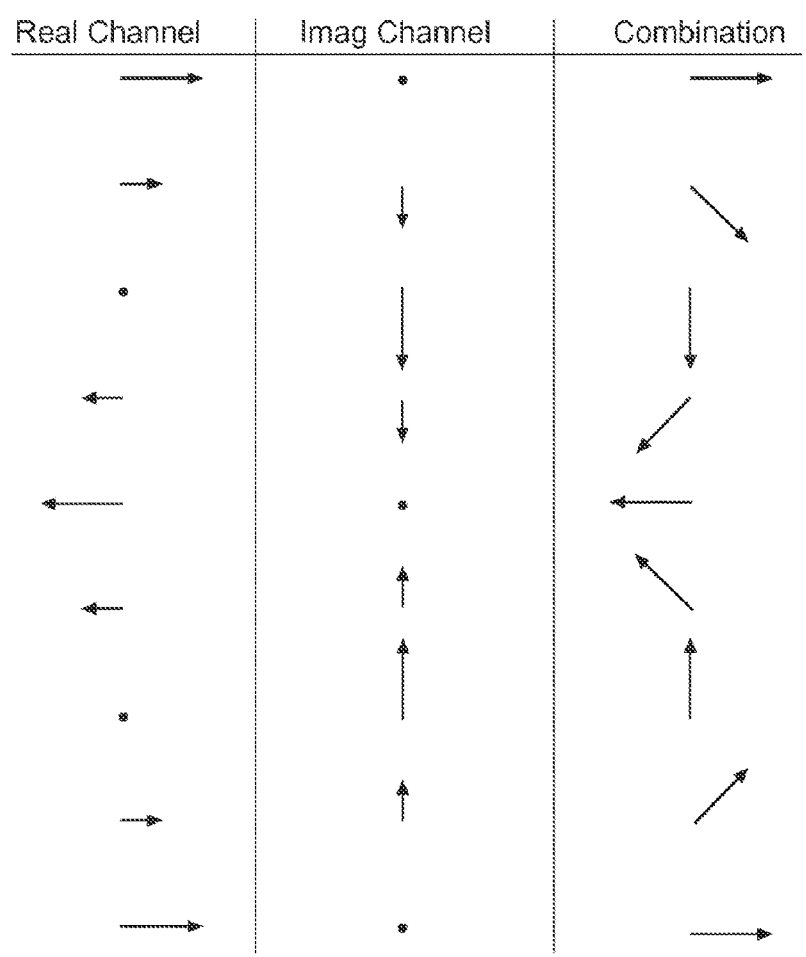

Now consider a system with two antennas. If the first field is in the real ("X") direction and the second is in the imaginary ("Y") direction (as referenced, for example, in FIG. 17), a polarized field is created by starting the second channel's amplitude at 0 and the first channel's amplitude at a maximum, thus, this would be considered as having the antenna 90° out of phase.

$$B1_{total}=|B1_1|\cos(\omega t+\phi-\phi)+i|B1_2|\sin(\omega t+\phi-\phi).$$

Figure 18:
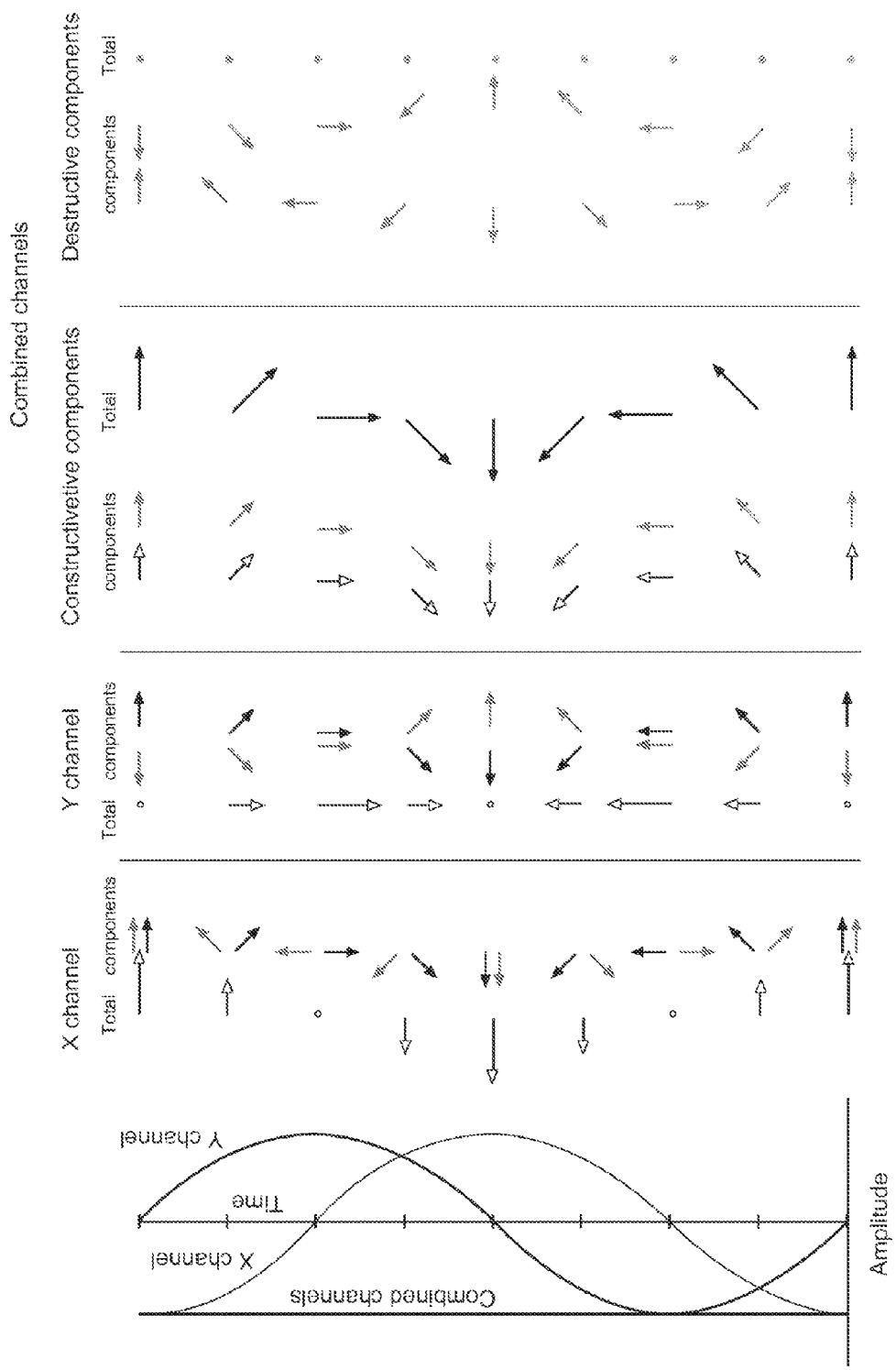

Splitting the two signals into their own polarized components gives the same polarized field solution, as shown for example in FIG. 18. Though perfectly orthogonal fields are preferred, two non-parallel fields can still give benefit. This introduces another angle, ($\theta$), which is the angle between $B_1$ fields at the point of interest. Discarding coupling the following $B_1$ fields can be created, with particular power savings.

Figure 19B:
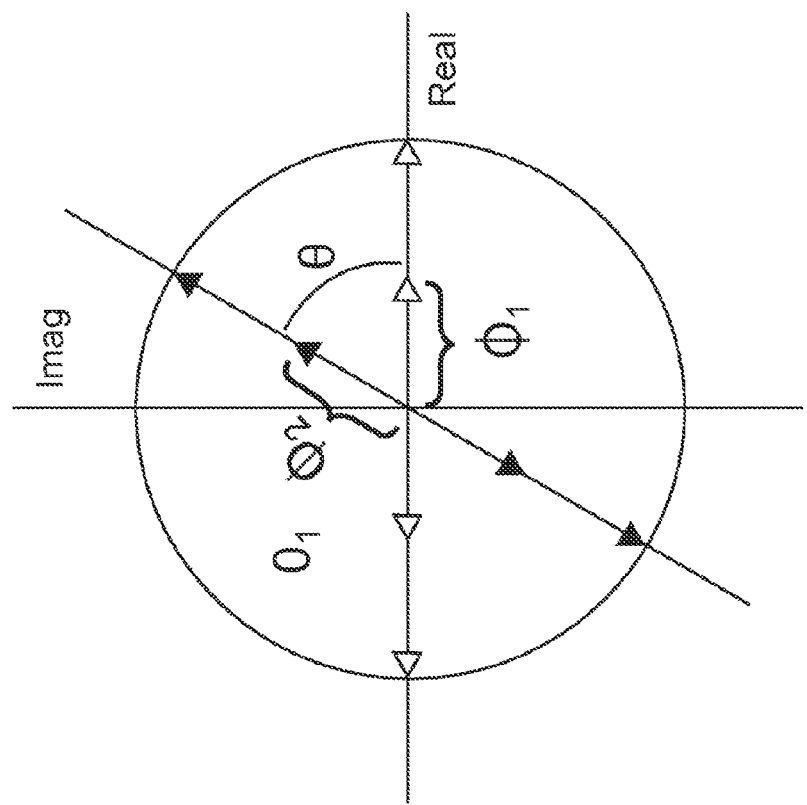
Figure 19A:
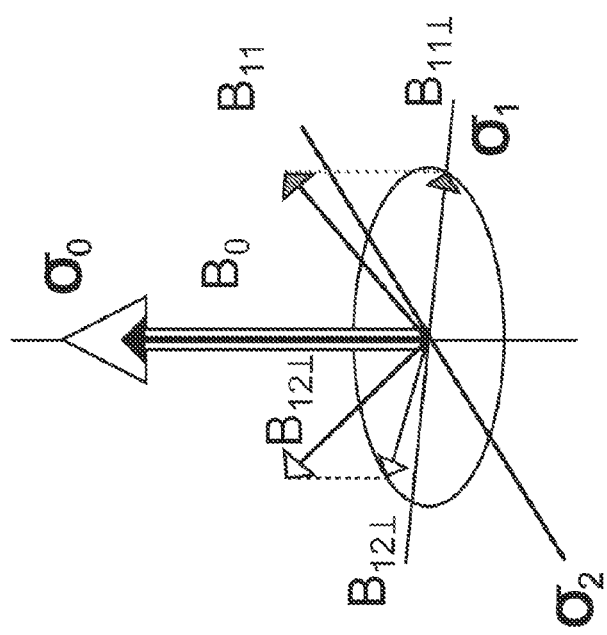

With reference to FIGS. 19A-19B, this angle $\theta$ can be represented, as follows.

$$B1_{total}=|B1_1|\cos(\omega_1 t+\phi_1-\phi_1)+|B1_2|\cos(\omega_2 t+\phi_2-\omega_2)$$
$$\cos(\theta)+i|B1_2|\cos(\omega_2 t+\phi_2-\phi_2)\sin(\theta)$$

which can be simplified to:

$$B_{1_{total}}=|B1_1|\cos(\omega_1 t+\phi_1-\phi_1)+|B1_2|\cos(\omega_2 t+\phi_2-\phi_2)e^{i\theta}$$

and breaking this into its counter rotating components yields:

$$B_{1_{total}}^{(+)} = \frac{1}{2}(|B1_1|e^{i(\omega_1 t+\phi_1-\varphi_1)} + |B1_2|e^{i(\omega_2 t+\phi_2-\varphi_2+\theta)})$$

$$B_{1_{total}}^{(-)} = \frac{1}{2}(|B1_1|e^{-i(\omega_1 t+\phi_1-\varphi_1)} + |B1_2|e^{-i(\omega_2 t+\phi_2-\varphi_2-\theta)})$$

Figure 20:
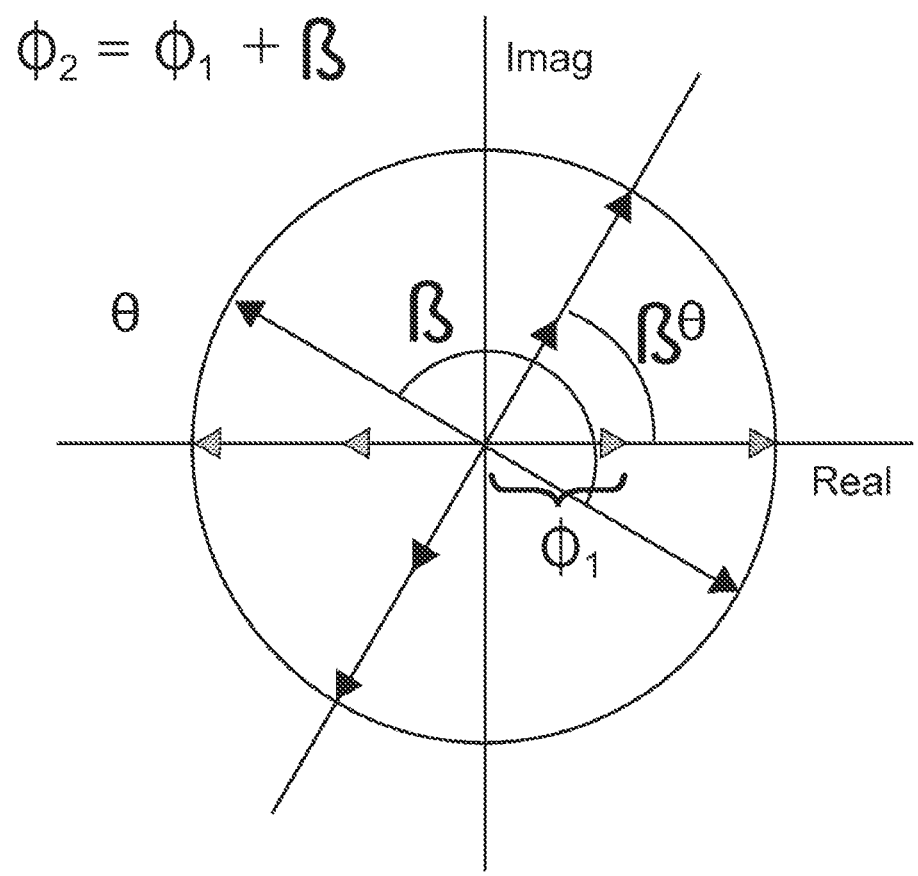

The user controls the two phases of the currents in the antenna coils. To simplify the process and make the best choice of angle, a simple relationship can be introduced: $\phi_2=\phi_1+\beta$. This means that the phases are separated by an angle $\beta$ as shown for example in FIG. 20.

Now one considers the selection of the optimum angle ($\beta$). Angle ($\alpha$) discussed herein is the physical angle between the coils of the two antennae. It is a singular value and can be set by a user building the NMR tool under discussion here. Angle ($\theta$) discussed herein is dependent on a position in space. For every position (x,y,z) there is a different angle ($\theta$). Angle ($\beta$) discussed herein is the transmission phase difference chosen by the user. For a particular point, the optimal choice in phase difference ($\beta$) is $-(\theta)$. For a system where all points are orthogonal ($\beta$) is selected to be 90 degrees, since ($\beta$) should be equal to $-(\theta)$ and 90 and $-90$ are equivalent in that case. A real-world system however is unlikely to exhibit complete orthogonality. In a real-world case, an angle ($\alpha$) is chosen for the system which maximizes the desired signal-to noise attributes via experimentation or simulation. That angle ($\alpha$) is likely related to the signal weighted average of angles in the sensitive volume being assessed. It is expected that the angle ($\alpha$) which will give the best signal-to-noise attributes will be close to or equal the average angle ($\theta$).

Conceptually the best $B_{1_{total}}$ is when the magnitude of the $B_{1_{total}}^{(+)}$ is $|B1_1|+|B1_2|$ and $\omega_0=\omega_1=\omega_2$. This happens when $\beta=-\theta$:

$$B_{1_{total}}^{(+)} = \frac{1}{2}(|B1_1|e^{i(\omega_0 t+\phi_1-\varphi_1)} + |B1_2|e^{i(\omega_0 t+\phi_1-\varphi_2)}) =$$

$$\frac{1}{2}[e^{i(\omega_0 t+\phi_1)}(|B1_1|e^{-\varphi_1} + |B1_2|e^{-\varphi_2})]$$

$$B_{1_{total}}^{(-)} = \frac{1}{2}(|B1_1|e^{-i(\omega_0 t+\phi_1-\varphi_1)} + |B1_2|e^{-i(\omega_0 t+\phi_1-\varphi_2-2\theta)}) =$$

$$\frac{1}{2}[e^{i(\omega_0 t+\phi_1-\varphi_2)}(|B1_1|e^{-\varphi_1} + |B1_2|e^{-2\theta-\varphi_2})]$$

Once the optimum angle ($\beta$) has been found, the next consideration is an examination of the amount of saved power. Though angle ($\theta$) is determined at each point in space, a general angle ($\theta$) can be assessed either by experiment or modeling found for the orientation of the coils to each other. Power losses are related to the current and resistivity for a single coil: $P_{loss}=I^2 R$ where R is the resistivity in the sonde. The energy stored in a single antenna is deduced from its self-inductance:

$$= \frac{1}{2}I^2 L.$$

Figure 21:
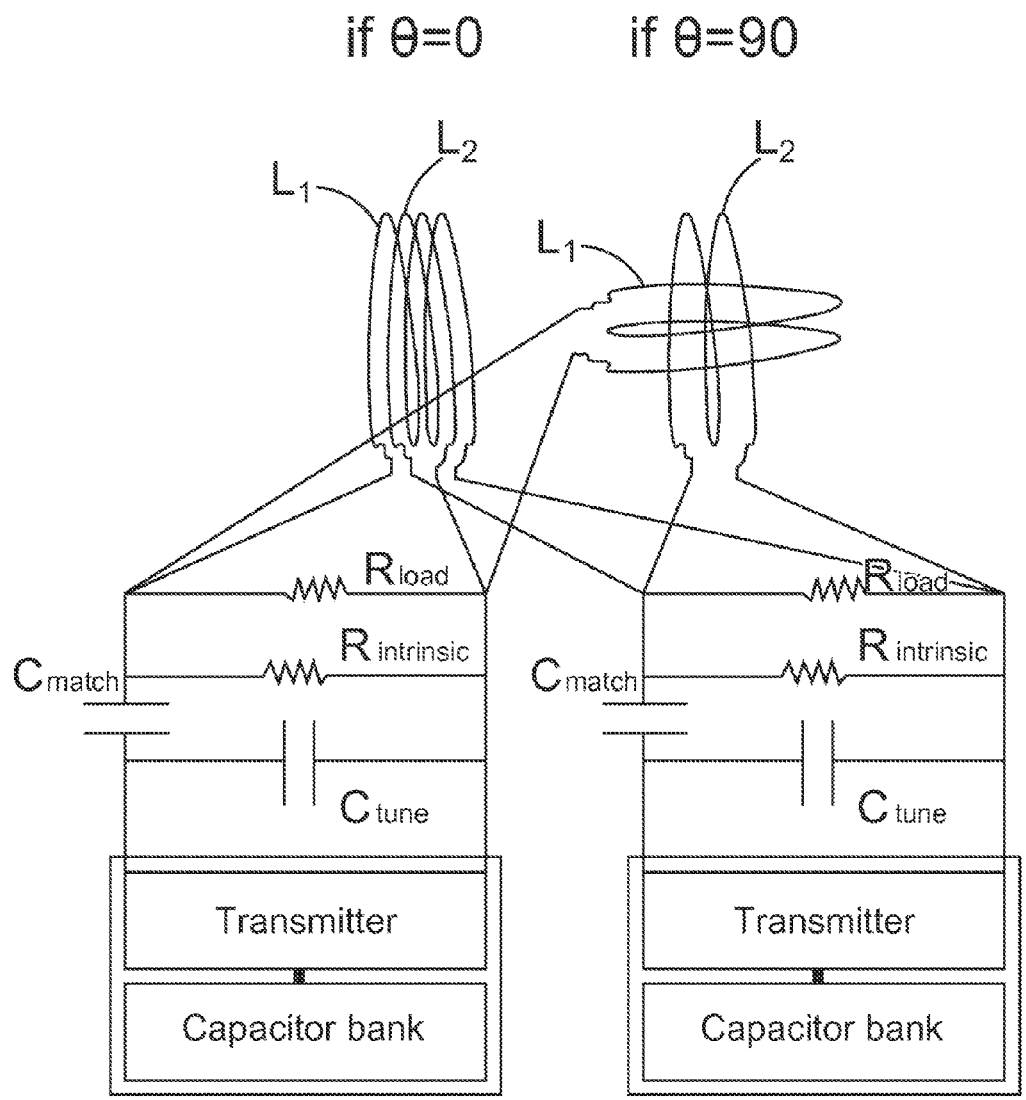

When there are multiple coils, each one has a mutual inductance with each of the other coils. This can be shown figuratively, for example as seen in FIG. 21.

Figure 22:
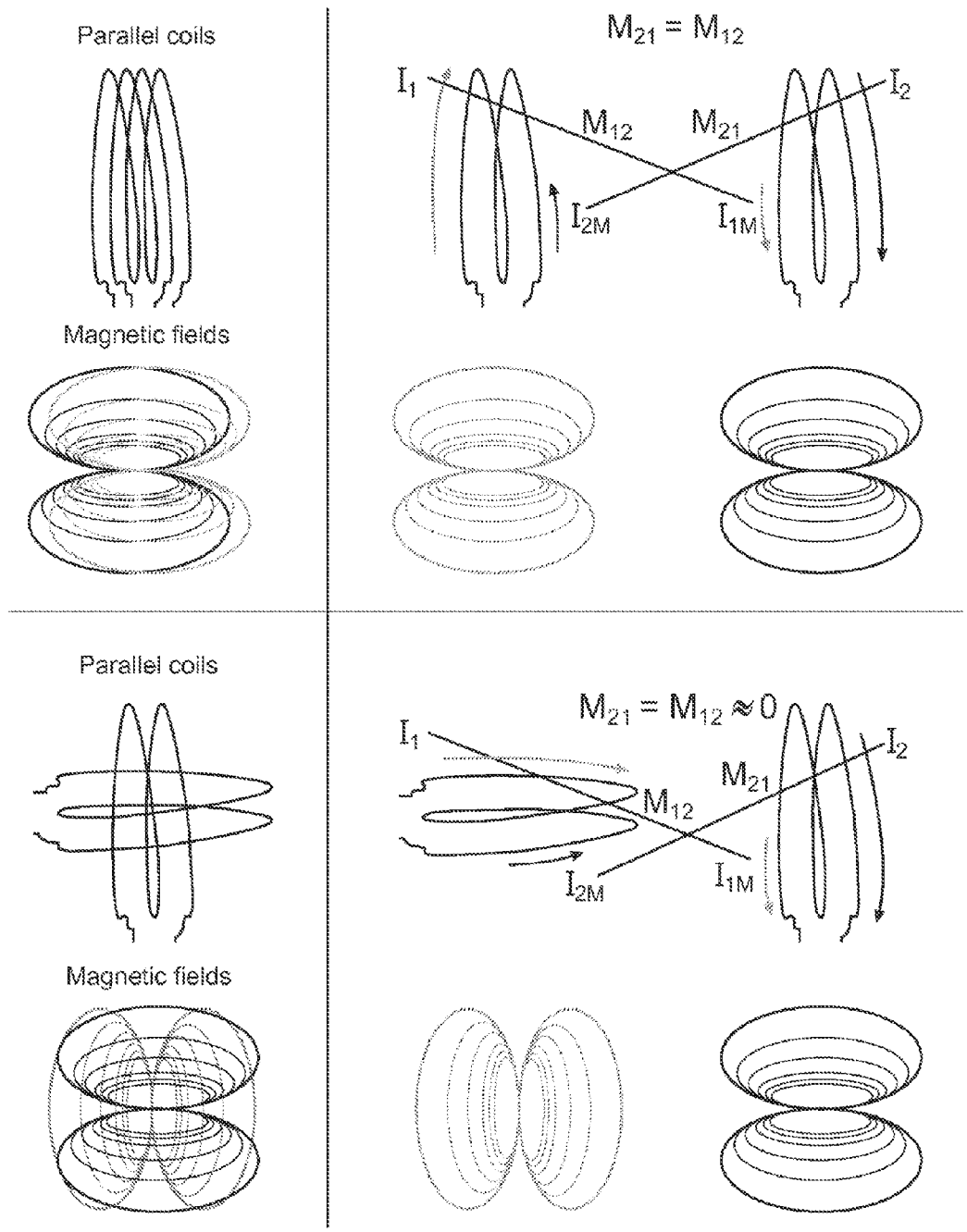

Two specific examples that illustrate magnetic fields generated by parallel and perpendicular coils are shown in FIG. 22. Generally, the power of such configurations can be expressed as:

$$P = \frac{1}{2}\langle I_1\rangle_{rms}^2(L_1 + M(\theta)) + \frac{1}{2}\langle I_2\rangle_{rms}^2(L_2 + M(\theta))$$

$$M = k\sqrt{L_1 L_2}$$

$$k = k'\cos(\theta)$$

In a two-antenna transmitter system, the following may be considered:

$$Bx=A\cos(\omega t), By=B\sin(\omega t+\beta)$$

where the angle between the two transmitters is $\alpha+\pi/2$ (close to $\pi/2$, $\alpha$ is small), $\beta$ is offset from quadrature and coupling is ignored when they are not orthogonal $$B1 = A\cos(\omega t) + e^{\pi/2+\alpha}B\sin(\omega t + \beta)$$

$$= A/2(e^{j\omega t} + e^{-j\omega t}) - iB/2e^{\pi/2+\alpha}(e^{j(\omega t+\beta)} - e^{-j(\omega t+\beta)})$$

$$= (A/2 - iB/2e^{\pi/2+\alpha}e^{j\beta})e^{j\omega t} + (A/2 + iB/2e^{\pi/2+\alpha}e^{-j\beta})e^{-j\omega t}$$

When the transmitters are orthogonal ($\alpha=0$), the amplitudes are the same (A=B), $\beta=0$ $$B1 = A\ e^{j\omega t}$$

In an elliptical configuration and when the transmitters are orthogonal ($\alpha=0$), the amplitudes are different (A$\sim$=B), $\beta=0$ $$B1 = A\cos(\omega t) + iB\sin(\omega t) = A/2(e^{j\omega t} + e^{-j\omega t}) + B/2(e^{j\omega t} - e^{-j\omega t})$$

$$= (A+B)/2e^{j\omega t} + (A-B)/2e^{-j\omega t}$$

$(A-B)/2$ is wasted.

When the transmitters are orthogonal ($\alpha=0$), the amplitudes are the same (A=B), the quadrature phase offset is not zero ($\beta=0$)

$$B1 = A/2(1 + e^{j\beta})e^{j\omega t} + A/2(1 - e^{-j\beta})e^{-j\omega t}$$

$$= A/2\chi e^{j(\omega t+\gamma)} + A/2(1 - e^{-j\beta})e^{-j\omega t}$$

where $\chi^{j\gamma}=/+e^{j\beta}$

An extra phase $\gamma$ is introduced, and $A/2\ (1-e^{-j\beta})$ is wasted.
When two transmitters are not orthogonal ($\alpha\sim=0$) and coupling is ignored:

$$B1 = (A/2 - iB/2e^{\pi/2+\alpha}e^{j\beta})e^{j\omega t} + (A/2 + iB/2e^{\pi/2+\alpha}e^{-j\beta})e^{-j\omega t}$$

$$= Ce^{j(\omega t+\gamma)} + (A/2 + iB/2e^{\pi/2+\alpha}e^{-j\beta})e^{-j\omega t}$$

where $C\ e^{j\gamma}=A/2-iB/2\ e^{\pi/2+\alpha}e^{j\beta}$
An extra phase $\gamma$ is introduced, and $(A/2+iB/2\ e^{\pi/2+\alpha}e^{-j\beta})$ $e^{-j\omega t}$ is wasted.

Referring back to FIGS. 1-22, it can be seen that many embodiments are possible to include a nuclear magnetic resonance (NMR) logging tool comprising an arrangement of one or more magnets to generate a static magnetic field ($B_0$) in a material body; a pair of first and second antenna coils attached to the tool around an antenna core, wherein the turns of the first and second antenna coils are unaligned with either a longitudinal axis of the tool or an orthogonal axis substantially transverse thereto; and circuitry that drives the pair of first and second antenna coils in concert to produce a radio frequency field ($B_1$) in the material body.

In some embodiments, the first and second antenna coils of the tool have a common longitudinal axis and are wound around a common antenna core. The first antenna coil may include a spirally wound coil configuration around the antenna core, and the second antenna coil may include an oppositely wound spiral configuration around the common antenna core.

In some embodiments, the turns in the first antenna coil are separated from the corresponding turns in the second oppositely wound antenna coil by an angle (α). The angle (α) may be in the range of 20 to 160 degrees or 70 to 110 degrees. In some embodiments, the angle (α) exceeds 90 degrees. In further embodiments, the angle (α) is selected to minimize a power draw of the tool, or to maximize one or more of SNR/echo, SNR*$\sqrt{\text{Gradient}}$, SNR/time, or SNR/$\sqrt{\text{power}}$ of the tool for a predetermined configuration of the magnet arrangement and common antenna core of the tool.

In some embodiments, the first and second antenna coils are configured to provide substantially orthogonal radio frequency fields in a material body. The first antenna coil may be energized by radio frequency power having a positive or negative 90 degree phase difference from radio frequency power energizing the second antenna coil, whereby a circularly polarized RF magnetic field is generated by the tool.

Figure 23:
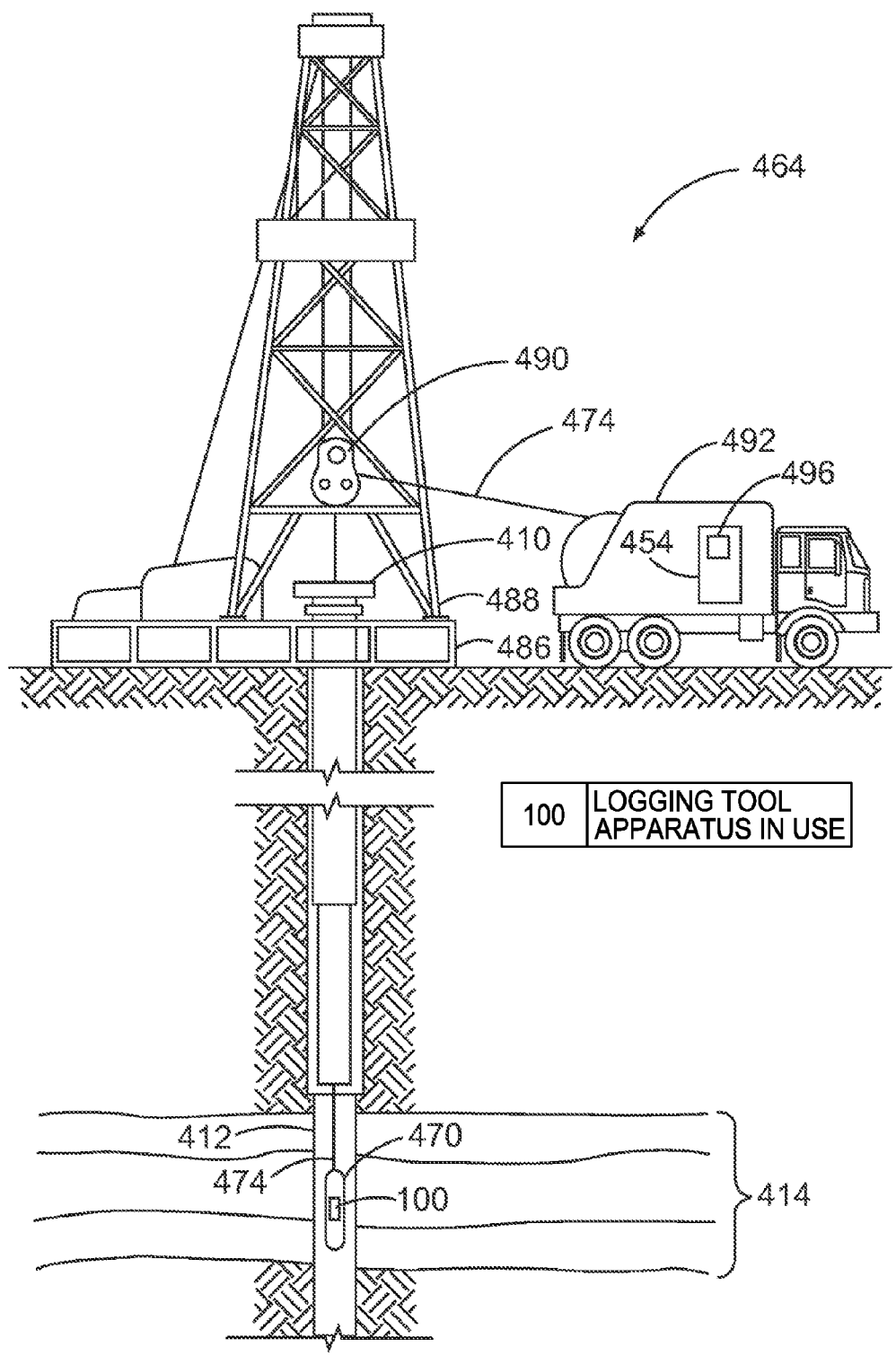
FIG. 23 illustrates a wire line system embodiment of the invention.
Figure 24:
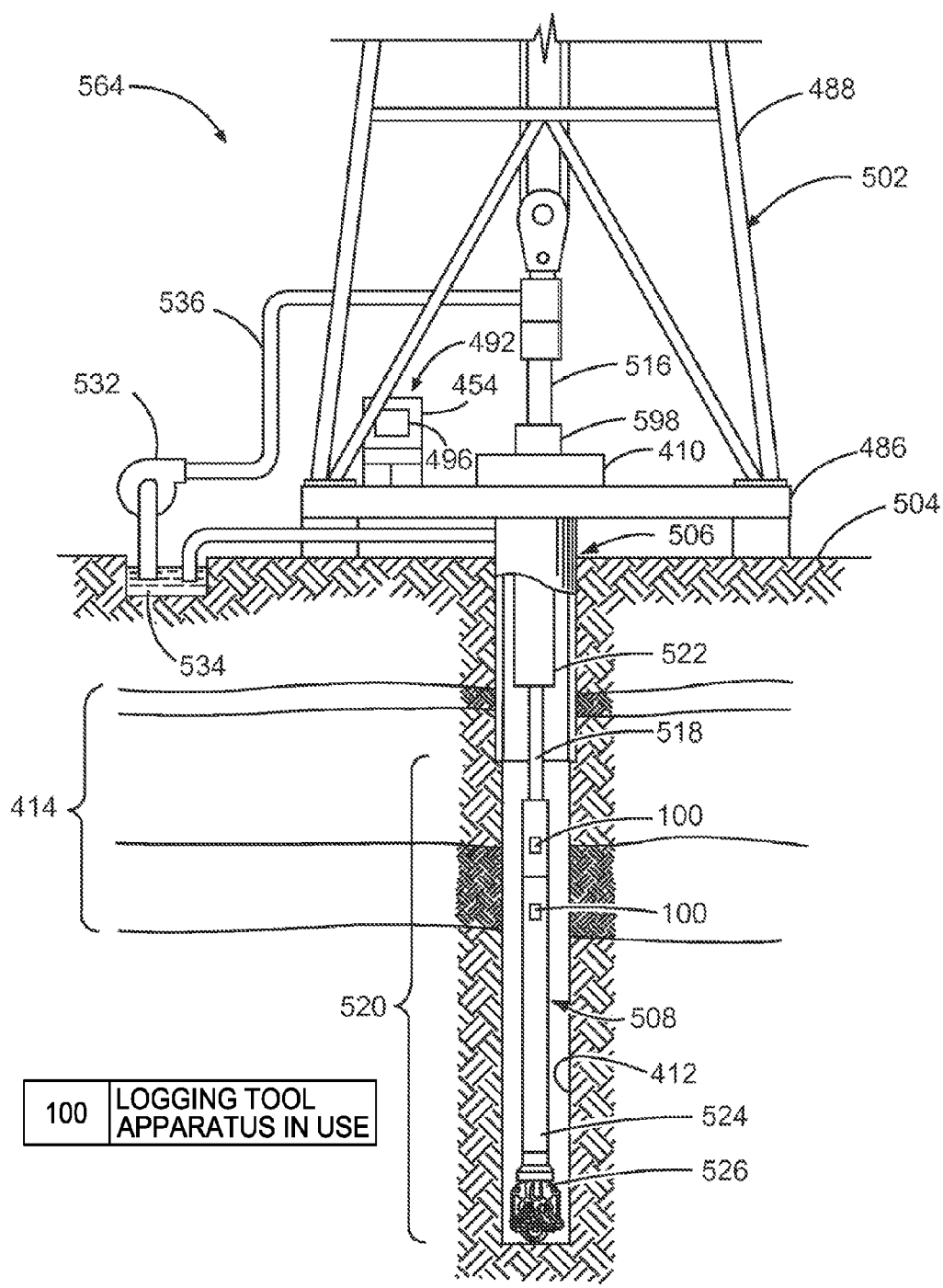
FIG. 24 illustrates a drilling rig system embodiment of the invention.

FIG. 23 illustrates an ex-situ wire line system 464 embodiment of the invention and FIG. 24 illustrates an ex-situ drilling rig system 564 embodiment of the invention. As such, the systems 464, 564 may comprise portions of a wire line logging tool body 470 as part of a wire line logging operation, or of a down-hole tool 524 as part of a down-hole drilling operation.

Thus, FIG. 23 shows a well during wire line logging operations. In this case, a drilling platform 486 is equipped with a derrick 488 that supports a hoist 490. Drilling oil and gas wells is commonly carried out using a string of drill pipes connected together so as to form a drilling string that is lowered through a rotary table 410 into a wellbore or borehole 412. Here, it is assumed that the drilling string has been temporarily removed from the borehole 412 to allow a wire line logging tool body 470, such as a probe or sonde, to be lowered by a wire line or logging cable 474 into the borehole 412. Typically, the wire line logging tool body 470 is lowered to the bottom of the region of interest and subsequently pulled upward at a substantially constant speed.

During an upward or downward trip and at a series of depths, various instruments (e.g., portions of the apparatus 100, or system 164 shown in FIG. 1) included in the wire line logging tool body 470 may be used to perform measurements on the subsurface geological formations 414 adjacent to the borehole 412 (and the wire line logging tool body 470). The measurement data can be communicated to a surface logging facility 492 for processing, analysis, and/or storage. The logging facility 492 may be equipped with electronic equipment for various types of signal processing, which may be implemented by any one or more of the components of the apparatus 100 or system 164 of FIG. 1. Similar formation evaluation data may be gathered and analyzed during drilling operations (e.g., during LWD operations, and by extension, sampling while drilling).

In some embodiments, the wire line logging tool body 470 is suspended in the wellbore by a wire line cable 474 that connects the tool to a surface control unit (e.g., comprising a workstation 454). The tool may be deployed in the borehole 412 on coiled tubing, jointed drill pipe, hard wired drill pipe, or any other suitable deployment technique.

Turning now to FIG. 24, it can be seen how a system 564 may also form part of a portion of a drilling rig 502 located at the surface 504 of a well 506. The drilling rig 502 may provide support for a drill string 508. The drill string 508 may operate to penetrate the rotary table 410 for drilling the borehole 412 through the subsurface geological formations 414. The drill string 508 may include a Kelly 516, drill pipe 518, clamp or collar 598, and a bottom hole assembly 520, perhaps located at the lower portion of the drill pipe 518.

The bottom hole assembly 520 may include drill collars 522, a down-hole tool 524, and a drill bit 526. The drill bit 526 may operate to create the borehole 412 by penetrating the surface 504 and the subsurface geological formations 414. The down-hole tool 524 may comprise any one of a number of different types of tools including MWD tools, LWD tools, and others.

During drilling operations, the drill string 508 (perhaps including the Kelly 516, the drill pipe 518, and the bottom hole assembly 520) may be rotated by the rotary table 410. Although not shown, the bottom hole assembly 520 may also be rotated by a motor (e.g., a mud motor) that is located down-hole. The drill collars 522 may be used to add weight to the drill bit 526. The drill collars 522 may also operate to stiffen the bottom hole assembly 520, allowing the bottom hole assembly 520 to transfer the added weight to the drill bit 526 and, in turn, to assist the drill bit 526 in penetrating the surface 504 and subsurface formations 414.

During drilling operations, a mud pump 532 may pump drilling fluid (sometimes known by those of ordinary skill in the art as "drilling mud") from a mud pit 534 through a hose 536 into the drill pipe 518 and down to the drill bit 526. The drilling fluid can flow out from the drill bit 526 and be returned to the surface 504 through an annular area between the drill pipe 518 and the sides of the borehole 412. The drilling fluid may then be returned to the mud pit 534 where such fluid is filtered. In some embodiments, the drilling fluid can be used to cool the drill bit 526, as well as to provide lubrication for the drill bit 526 during drilling operations. Additionally, the drilling fluid may be used to remove subsurface formation cuttings created by operating the drill bit 526.

In some embodiments, systems 164, 464, 564 may include drill collars 522, a down-hole tool 524, and/or a wire line logging tool body 470 to house one or more apparatus 100, similar to or identical to the apparatus 100 of FIG. 1. Components of the system 164 in FIG. 1 may also be housed by the down-hole tool 524 or the wire line logging tool body 470.

Thus, for the purposes of this document, the term "housing" may include any one or more of a drill collar 522, a down-hole tool 524, or a wire line logging tool body 470 (all having an outer surface and an inner surface, used to enclose or attach to magnetometers, sensors, fluid sampling devices, pressure measurement devices, temperature measurement devices, transmitters, receivers, acquisition and processing logic, and data acquisition systems). The down-hole tool 524 may comprise a logging while drilling (LWD) tool, or an MWD tool. The wire line logging tool body 470 may comprise a wire line logging tool, including a probe or sonde, for example, coupled to a logging cable 474. Many embodiments may, thus, be realized.

For example, in some embodiments, a system 464, 564 may include a display 496 to present processed/calculated and measured NMR data, as well as database information, perhaps in graphic form. A system 464, 564 may also include computation logic, perhaps as part of a surface logging facility 492 or a computer workstation 454, to receive signals from transmitters and to send signals to receivers, and other instrumentation, to determine properties of the subsurface geological formations 414.

Thus, a system 464, 564 may comprise a down-hole tool body, such as a wire line logging tool body 470 or a down-hole tool 524 (e.g., an LWD or MWD tool body), and portions of one or more apparatus 100 attached to the tool body 470, the apparatus 100 to be constructed and operated as previously described. The processor(s) 130 in the systems 464, 564 may be attached to the housing 104 or located at the surface as part of a surface computer (e.g., in the surface logging facility 154) as shown in FIG. 1.

The apparatus 100; housing 104; field 112; subsurface geological formations 114, 414; images 118; data acquisition system 124; processor(s) 130; database 134; logic 140; transceiver 144; memory 150; logging facilities 154, 492; systems 164, 464, 564; surface 166; data 170; rotary table 410; borehole 412; computer workstations 454; wire line logging tool body 470; logging cable 474; drilling platform 486; derrick 488; hoist 490; logging facility 492; display 496; drill string 508; Kelly 516; drill pipe 518; bottom hole assembly 520; drill collars 522; down-hole tool 524; drill bit 526; mud pump 532; mud pit 534; hose 536; receiver(s) R; and transmitters(s) T may all be characterized as "modules" herein.

Such modules may include hardware circuitry, and/or a processor and/or memory circuits, software program modules and objects, and/or firmware, or combinations thereof, as desired by the architect of the apparatus 100 and systems 164, 464, 564 and as appropriate for particular implementations of various embodiments. For example, in some embodiments, such modules may be included in an apparatus and/or system operation simulation package, such as a software electrical signal simulation package, a power usage and distribution simulation package, a power/heat dissipation simulation package, and/or a combination of software and hardware used to simulate the operation of various potential embodiments.

It should also be understood that the apparatus and systems of various embodiments can be used in applications other than for logging operations and, thus, various embodiments are not to be limited. The illustrations of apparatus 100 and systems 164, 464, 564 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules. Such apparatus and systems may further be included as sub-components within a variety of electronic systems, such as televisions, cellular telephones, personal computers, workstations, radios, video players, vehicles, signal processing for geothermal tools and smart transducer interface node telemetry systems, among others. Some embodiments include a number of methods.

Figure 25:
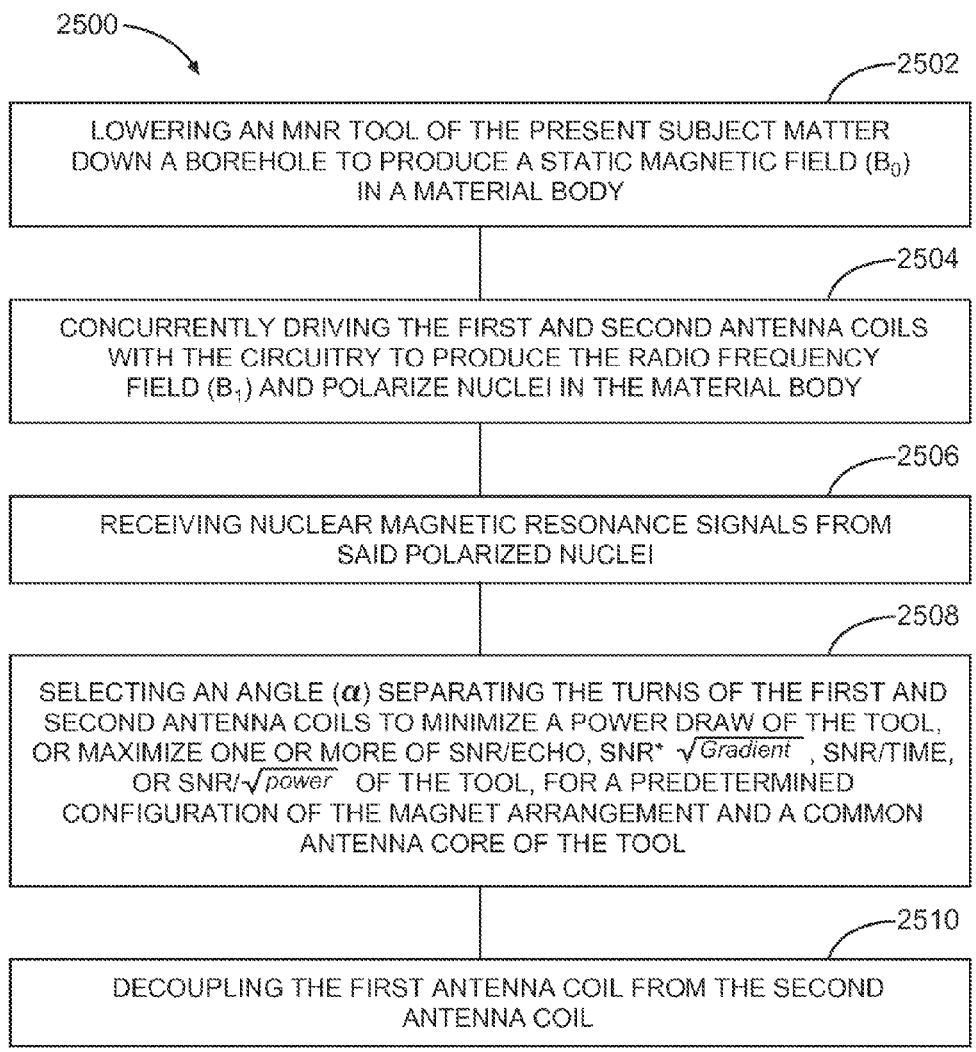
FIG. 25 is a flow chart illustrating several methods, according to various embodiments of the invention.

For example, FIG. 25 is a flow chart illustrating several NMR method operations 2500 according to various embodiments of the invention. At operation 2502, an NMR tool is lowered down a borehole to produce a static magnetic field ($B_0$) in a material body. The tool may comprise a pair of first and second antenna coils attached to the tool around an antenna core, the turns of the first and second antenna coils being unaligned with either a longitudinal axis of the tool or an orthogonal axis substantially transverse thereto. The tool may further comprise circuitry that drives the pair of first and second antenna coils in concert to produce a radio frequency field ($B_1$) in said material body. At operation 2504, the first and second antenna coils are concurrently driven with the circuitry to produce the radio frequency field ($B_1$) and polarize nuclei in the material body. At operation 2506, nuclear magnetic resonance signals are received from said polarized nuclei.

In some embodiments, the first and second antenna coils of the tool have a common longitudinal axis and are wound around a common antenna core. In some embodiments, the first antenna coil includes a spirally wound coil configuration around the antenna core, wherein the second antenna coil includes an oppositely wound spiral configuration around the common antenna core.

In some embodiments, the turns in the first antenna coil are separated from corresponding turns in the second oppositely wound antenna coil by an angle ($\alpha$). The angle ($\alpha$) may be in the range of 20 to 160 degrees, or 70 to 110 degrees. In some embodiments, the angle ($\alpha$) exceeds 90 degrees.

At operation 2508, the angle ($\alpha$) is selected to minimize a power draw of the tool, or maximize one or more of SNR/echo, SNR*$\sqrt{\text{Gradient}}$, SNR/time, or SNR/$\sqrt{\text{power}}$ of the tool, for a predetermined configuration of the magnet arrangement and common antenna core of the tool.

In some embodiments, the first and second antenna coils may be configured to provide substantially orthogonal radio frequency fields in said material body. In some embodiments, the first antenna coil may be energized by radio frequency power having a 90 degree phase difference from the radio frequency power energizing the second antenna coil, whereby a circularly polarized RF magnetic field is generated by the tool. At operation 2510, the first antenna is decoupled from the second antenna coil.

Figure 26:
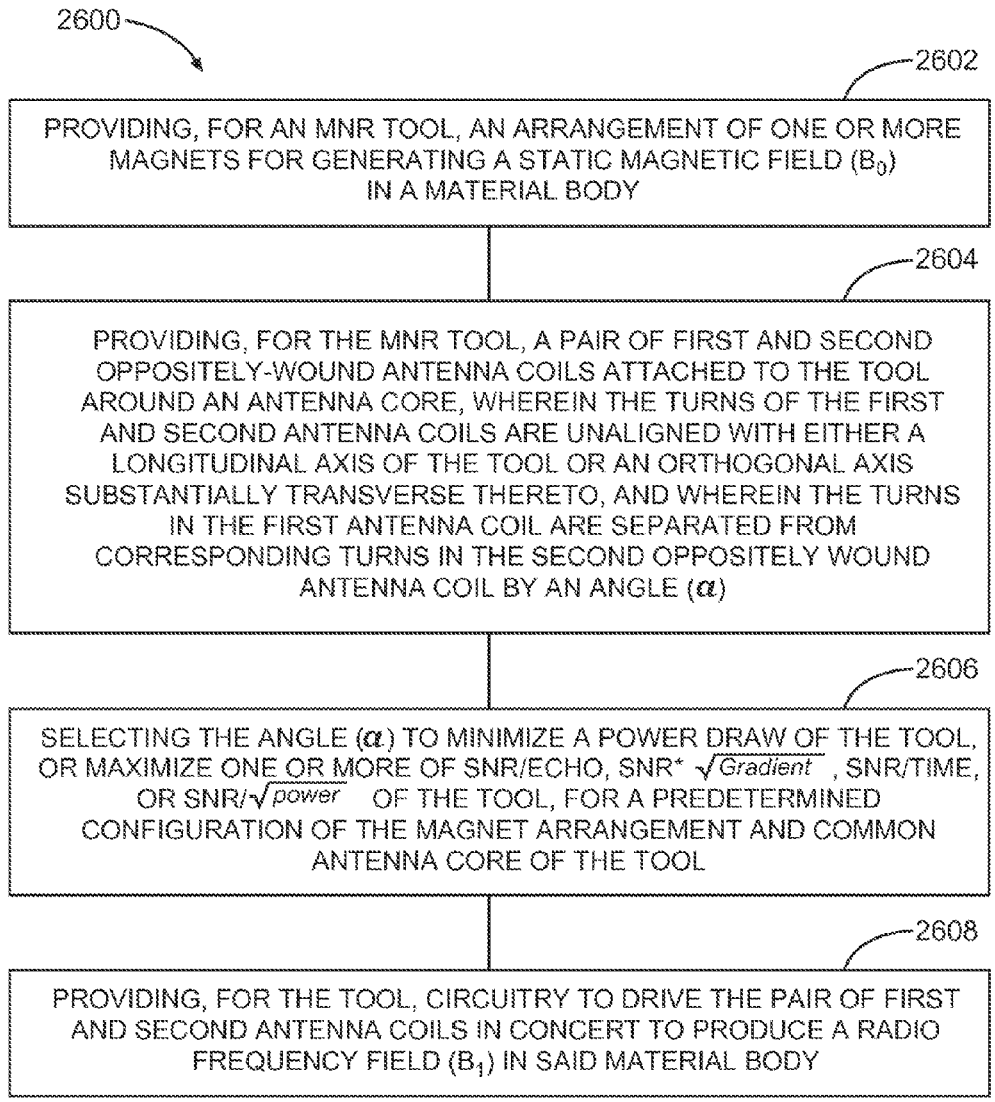
FIG. 26 is a flow chart illustrating several methods, according to various embodiments of the invention.

With reference to FIG. 26, another embodiment may include method 2600 of making a nuclear magnetic resonance (NMR) logging tool. At operation 2602, an arrangement of one or more magnets for generating a static magnetic field ($B_0$) in a material body are provided for the NMR logging tool; at operation 2604, a pair of first and second oppositely-wound antenna coils attached to the tool around an antenna core are provided for the NMR logging tool, wherein the turns of the first and second antenna coils are unaligned with either a longitudinal axis of the tool or an orthogonal axis substantially transverse thereto, and wherein the turns in the first antenna coil are separated from corresponding turns in the second oppositely wound antenna coil by an angle ($\alpha$); at operation 2606, the angle ($\alpha$) is selected to minimize a power draw of the tool, or maximize one or more of SNR/echo, SNR*$\sqrt{\text{Gradient}}$, SNR/time, or SNR/$\sqrt{\text{power}}$ of the tool, for a predetermined configuration of the magnet arrangement and common antenna core of the tool; and, at operation 2608, circuitry that can drive the pair of first and second antenna coils in concert to produce a radio frequency field ($B_1$) in said material body is provided for the NMR logging tool.

It should be noted that the processes and methods described herein do not have to be executed in the order described, or in any particular order. Moreover, various activities or operations described with respect to the processes and methods identified herein can be executed in iterative, serial, or parallel fashion. The various elements of each process and method (e.g., the methods shown in FIGS. 25-26) can be substituted, one for another, within and between the processes and methods. Information, including parameters, commands, operands, and other data, can be sent and received in the form of one or more carrier waves.

The present subject matter, therefore, provides advantages. First, tool power consumption can be lowered while maintaining the ($B_1$) field strength or, in other examples, tool power consumption can be maintained to deliver either more pulses of ($B_1$) or stronger ($B_1$) pulses. The increased power available in the transmitter can increase the utility of a tool. Aspects, such as shorter measurement time and enhanced echoing, become possible and the effect of measurements on productive drilling time can be minimized.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-oriented format using an object-oriented language such as Java or C#. In another example, the programs can be structured in a procedure-oriented format using a procedural language, such as assembly or C or hardware description language, such as VHDL. The software components may communicate using any of a number of mechanisms well known to those skilled in the art, such as application program interfaces or inter-process communication techniques, including remote procedure calls. The teachings of various embodiments are not limited to any particular programming language or environment. Thus, other embodiments may be realized.

Figure 27:
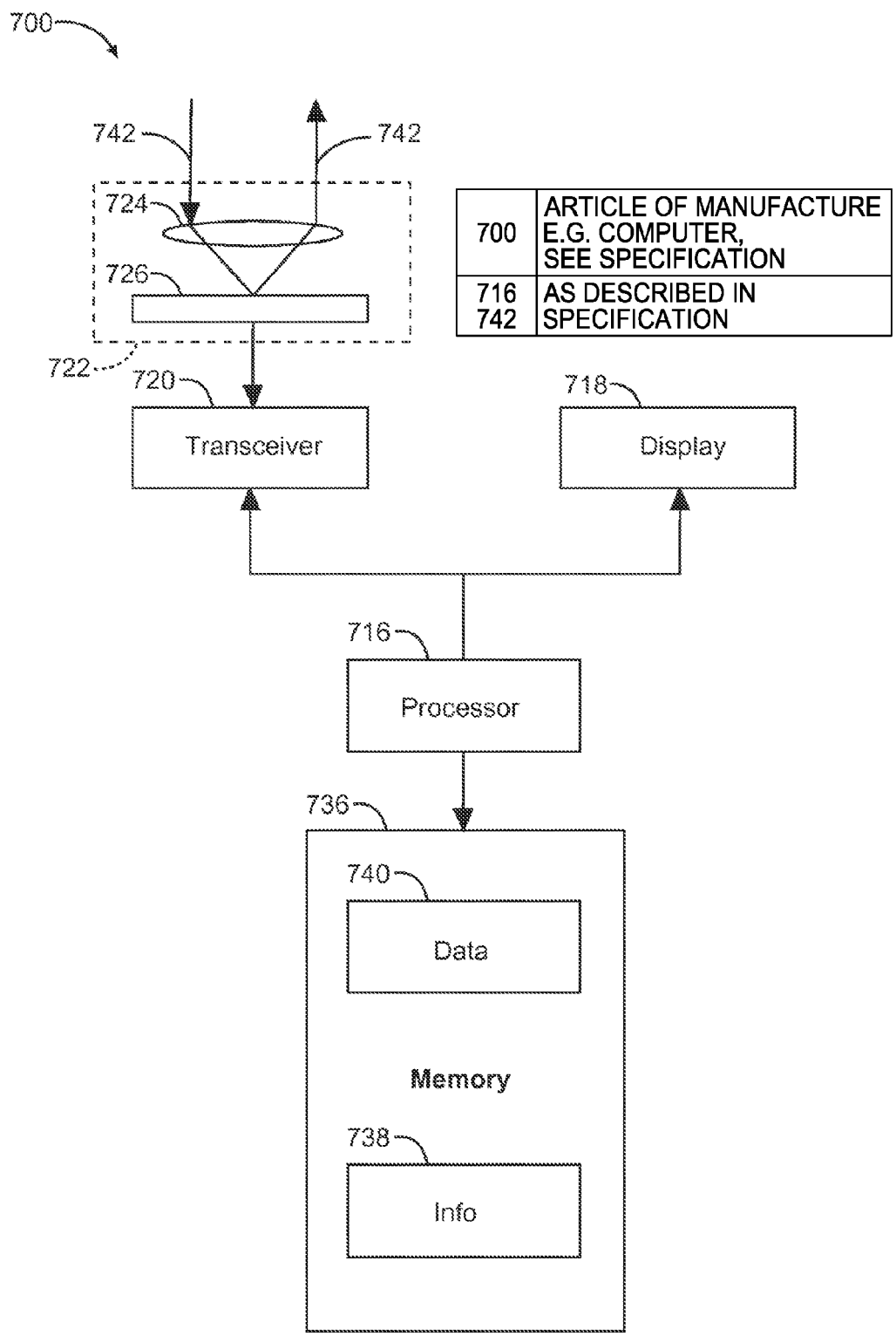
FIG. 27 is a block diagram of an article, according to various embodiments of the invention.

For example, FIG. 27 is a block diagram of an article 700 of manufacture, such as a computer, a memory system, a magnetic or optical disk, or some other storage device, according to various embodiments. The article 700 may include one or more processors 716 coupled to a machine-accessible medium such as a memory 736 (e.g., removable storage media, as well as any tangible, non-transitory memory including an electrical, optical, or electromagnetic conductor) having associated information 738 (e.g., computer program instructions and/or data), which when executed by one or more of the processors 716, results in a machine (e.g., the article 700) performing any actions described herein, including the methods of FIGS. 25-26, operating the apparatus of FIG. 1, and the systems of FIGS. 1, 23, and 24. The processors 716 may comprise one or more processors sold by Intel Corporation (e.g., Intel® Core™ processor family), Advanced Micro Devices (e.g., AMD Athlon™ processors), and other semiconductor manufacturers.

In some embodiments, the article 700 may comprise one or more processors 716 coupled to a display 718 to display data processed by the processor 716 and/or a wireless transceiver 720 (e.g., a down-hole telemetry transceiver) to receive and transmit data processed by the processor 716.

The memory system(s) included in the article 700 may include memory 736 comprising volatile memory (e.g., dynamic random access memory) and/or non-volatile memory. The memory 736 may be used to store data 740 processed by the processor 716.

In various embodiments, the article 700 may comprise communication apparatus 722, which may, in turn, include amplifiers 726 (e.g., preamplifiers or power amplifiers) and one or more antenna 724 (e.g., transmitting antennae and/or receiving antennae). Signals 742 received or transmitted by the communication apparatus 722 may be processed according to the methods described herein.

Many variations of the article 700 are possible. For example, in various embodiments, the article 700 may comprise a down-hole tool, including the apparatus 100 of FIG. 1. In some embodiments, the article 700 is similar or identical to the apparatus 100 or system 164 of FIG. 1.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. Therefore, this Detailed Description is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A nuclear magnetic resonance (NMR) logging tool comprising:
    an arrangement of one or more magnets that generate a static magnetic field ($B_0$) in a material body;
    a pair of first and second antenna coils attached to the NMR logging tool around an antenna core, wherein turns of the first and second antenna coils are unaligned with either a longitudinal axis of the NMR logging tool, or an orthogonal axis substantially transverse thereto, and wherein the turns in the first antenna coil are separated from corresponding turns in the second antenna coil by an angle ($\alpha$), the angle ($\alpha$) being selected in order to minimize a power draw of the NMR logging tool; and
    circuitry that drives the pair of first and second antenna coils in concert with one another in order to produce a radio frequency field ($B_1$), that is circularly polarized, in the material body.

2. The NMR logging tool of claim 1, wherein the first and second antenna coils have a common longitudinal axis and are wound around a common antenna core.

3. The NMR logging tool of claim 2,
wherein the first antenna coil includes a spirally wound coil configuration around the antenna core, and
wherein the second antenna coil includes an oppositely wound spiral configuration around the common antenna core.

4. The NMR logging tool of claim 1, wherein the angle ($\alpha$) is in a the range of 20 to 160 degrees or 70 to 110 degrees.

5. The NMR logging tool of claim 1, wherein the angle ($\alpha$) exceeds 90 degrees.

6. The NMR logging tool of claim 2, wherein the angle ($\alpha$) is selected in order to maximize one or more of SNR/echo, SNR*$\sqrt{}$Gradient, SNR/time, or SNR/$\sqrt{}$power of the NMR logging tool, as a part of a predetermined configuration of a magnet arrangement including the common antenna core that is part of the NMR logging tool.

7. The NMR logging tool of claim 1, wherein the first and second antenna coils having the turns that are unaligned with either a longitudinal axis of the NMR logging tool, or an orthogonal axis substantially transverse thereto are configured in order to provide substantially orthogonal radio frequency fields in the material body.

8. The NMR logging tool of claim 1, wherein the first antenna coil is energized by radio frequency power having a 90 degree phase difference from radio frequency power that is energizing the second antenna coil.

9. A nuclear magnetic resonance (NMR) logging method comprising:
lowering an NMR logging tool down a borehole in order to produce a static magnetic field ($B_0$) in a material body, the NMR logging tool comprising a pair of first and second antenna coils attached to the NMR logging tool around an antenna core, turns of the first and second antenna coils being unaligned with either a longitudinal axis of the NMR logging tool or an orthogonal axis substantially transverse thereto, and
wherein the turns in the first antenna coil are separated from corresponding turns in the second antenna coil by an angle ($\alpha$), the angle ($\alpha$) being selected in order to minimize a power draw of the NMR logging tool; and
the NMR logging tool further comprising:
circuitry that drives the pair of first and second antenna coils in concert with one another in order to produce a radio frequency field ($B_1$) that is circularly polarized, in the material body;
concurrently driving the first and second antenna coils with the circuitry producing the radio frequency field ($B_1$) that is circularly polarized, and thereby polarizing nuclei in the material body; and
receiving, with a receiver, nuclear magnetic resonance signals from the polarized nuclei in the material body; and
storing the received nuclear magnetic resonance signals with a machine-readable memory medium.

10. The NMR logging method of claim 9, wherein the first and second antenna coils have a common longitudinal axis and are wound around a common antenna core.

11. The NMR logging method of claim 10, wherein the first antenna coil includes a spirally wound coil configuration around the antenna core, and wherein the second antenna coil includes an oppositely wound spiral configuration around the common antenna core.

12. The NMR logging method of claim 9, wherein the angle ($\alpha$) is in a range of 20 to 160 degrees or 70 to 110 degrees.

13. The NMR logging method of claim 9, wherein the angle ($\alpha$) exceeds 90 degrees.

14. The NMR logging method of claim 10 wherein the angle ($\alpha$) is selected in order to maximize one or more of SNR/echo, SNR*$\sqrt{}$Gradient, SNR/time, or SNR/$\sqrt{}$power of the NMR logging tool, as a part of a predetermined configuration of a magnet arrangement including the common antenna core that is part of the NMR logging tool.

15. The NMR logging method of claim 9, wherein substantially orthogonal radio frequency fields in the material body are provided by the arrangement of the first and second antenna coils.

16. The NMR logging method of claim 15, wherein the first antenna coil is energized by radio frequency power having a 90 degree phase difference from a radio frequency power energizing the second antenna coil, whereby a circularly polarized RF magnetic field is generated by the NMR logging tool.

17. The NMR logging method of claim 9, wherein the first antenna coil is decoupled from the second antenna coil after concurrently driving the first and second antenna coils with the circuitry.

18. A method of arranging the components of a nuclear magnetic resonance (NMR) logging tool in order to provide circular polarization with the NMR logging tool, the method comprising:
placing, in the NMR logging tool, an arrangement of one or more magnets that generate a static magnetic field ($B_0$) in a material body, of an NMR logging tool;
positioning a pair of first and second oppositely-wound antenna coils that are attached to the NMR logging tool around a common antenna core, wherein turns of the first and second oppositely-wound antenna coils are unaligned with either a longitudinal axis of the NMR logging tool or an orthogonal axis substantially transverse thereto, and
wherein the turns in the first antenna coil are separated from corresponding turns in the second oppositely wound antenna coil by an angle ($\alpha$);
selecting the angle ($\alpha$) in order to minimize a power draw of the NMR logging tool, as a part of a predetermined configuration of the arrangement of the one or more magnets including the common antenna core that is part of the NMR logging tool; and
providing, circuitry configured to drive the pair of first and second oppositely-wound antenna coils in concert with one another in order to produce a radio frequency field ($B_1$), that is circularly polarized in the material body.

* * * * *